(12) United States Patent
Watanabe et al.

(10) Patent No.: US 7,876,483 B2
(45) Date of Patent: Jan. 25, 2011

(54) OPTICALLY RECONFIGURABLE LOGIC CIRCUIT

(75) Inventors: Minoru Watanabe, Iizuka (JP); Fuminori Kobayashi, Munakata (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 424 days.

(21) Appl. No.: 11/597,474

(22) PCT Filed: May 11, 2005

(86) PCT No.: PCT/JP2005/008612

§ 371 (c)(1),
(2), (4) Date: Jun. 8, 2009

(87) PCT Pub. No.: WO2005/117262

PCT Pub. Date: Dec. 8, 2005

(65) Prior Publication Data

US 2009/0296178 A1     Dec. 3, 2009

(30) Foreign Application Priority Data

May 26, 2004    (JP)   ............................ 2004-156769

(51) Int. Cl.
*G02F 3/00* (2006.01)
*H01L 27/118* (2006.01)

(52) U.S. Cl. ...................................... 359/108; 257/202

(58) Field of Classification Search ................. 359/108; 257/202
See application file for complete search history.

(56) References Cited

U.S. PATENT DOCUMENTS 6,057,703 A     5/2000     Mok et al.
(Continued)

FOREIGN PATENT DOCUMENTS

JP     2002-353317     12/2002
(Continued)

OTHER PUBLICATIONS

J.V. Campenhout, et al.; "Optoelectronic FPGA's;" *IEEE Journal of Selected Topics in Quantum Electronics*; vol. 5; No. 2; Mar./Apr. 1999; pp. 306-315.

(Continued)

*Primary Examiner*—Evan Pert
(74) *Attorney, Agent, or Firm*—Edwards Angell Palmer & Dodge LLP

(57) ABSTRACT

To provide an optically reconfigurable logic circuit in which a mount area of an optical circuit is reduced as much as possible and a high gate density is realized.

In an optically reconfigurable logic circuit 1 provided with a plurality of configuration information input circuits 6 for converting an optical signal including logic circuit configuration information into an electric signal and holding and outputting this electric signal and a logic configuration variable circuit 7 for performing logic configuration on the basis of the logic circuit configuration information, the configuration information input circuits 6 holds the logic circuit configuration information as electric charge with use of a junction capacitance and a floating capacitance of a photoconductive device P. An inter-terminal voltage of the photoconductive device P is converted into binary data by a binary circuit and output as a circuit configuration signal. Then, the logic configuration variable circuit 7 is configured to execute a logic arithmetic processing before the inter-terminal voltage of the photoconductive device P drops to be equal to or lower than a logic threshold of the binary circuit due to a leak current.

20 Claims, 18 Drawing Sheets

U.S. PATENT DOCUMENTS 6,072,608 A 6/2000 Psaltis et al.
6,222,755 B1 4/2001 Zhou et al.

FOREIGN PATENT DOCUMENTS

JP 2004-64017 2/2004

OTHER PUBLICATIONS

J. Mumbru, et al.; "Optically Programmable Gate Array;" *Optics in Computing 2000*; SPIE vol. 4089; 2000; pp. 763-771.

J. Mumbru, et al.; "Optical memory for computing and information processing;" *Part of the SPIE Conference on Algorithms, Devices, and Systems for Optical Information Processing III*; Jul. 1999; pp. 14-24.

M. Watanabe, et al.; "An Optically Differential Reconfigurable Gate Array and Its Power Consumption Estimate;" *IEEE*; 2002; pp. 197-202.

M. Watanabe, et al.; "An Optically Differential Reconfigurable Gate Array with a dynamic reconfiguration circuit;" *Proceedings of the International Parallel and Distributed Processing Symposium*; 2003; 4 Sheets.

J. Depreitere, et al.; "An Optoelectronic 3-D Field Programmable Gate Array;" pp. 352-360.

T.H. Szymanski, et al.; "Field-programmable logic devices with optical input-output;" *Applied Physics*; vol. 39; No. 5; Feb.10, 2000; pp. 721-732.

S.S. Sherif, et al.; "Field-programmable smart-pixel arrays: design, VLSI implementation, and applications;" *Applied Optics*; vol. 38; No. 5; Feb. 10, 1999; pp. 838-846.

M. F. Sakr, et al.; "Reconfigurable Processor Employing Optical Channels;" *Proceedings of the 1998 International Topical Meeting on Optics in Computing (OC'98)*; 1998; 4 Sheets.

M. Watanabe, et al.; "Digital associative memory neural network with optical learning capability;" *Opticals Communications 113*; Dec. 15, 1994; pp. 31-38.

H. Nakano, et al.; "Development of Dynamically Reconfigurable Processor LSI;" *NEC*; vol. 56; No. 4; 2003; pp. 99-102/Yes-Abstract.

U. Tangen, et al.; "Hardware Evolution with a Massively Parallel Dynamicaly Reconfigurable Computer: POLYP;" pp. 364-371.

configuration information input circuit 6 | logic configuration variable circuit 7

(a)

configuration information input circuit 6 | logic configuration variable circuit 7

(b)

OPTICALLY RECONFIGURABLE LOGIC CIRCUIT

TECHNICAL FIELD

The present invention relates to an optically reconfigurable logic circuit capable of performing reconfiguration on an internal circuit logic configuration while an optical signal that contains logic circuit configuration information is input. In particular, the invention relates to an optically reconfigurable logic circuit capable of increasing a gate density of an internal circuit by dynamically holding circuit configuration information.

BACKGROUND ART

As a device that can reconfigure a circuit logic configuration while logic circuit configuration information is input from the outside, a field programmable gate array: hereinafter referred to as "FPGA" is widely used. Furthermore, in order to reduce the circuit mount area by increasing an operating rate of the gate array as much as possible, in recent years, with the advanced research and development for a dynamically reconfigurable device, a demand for a high-speed reconfigurable device is being increased.

However, like the FPGA, with use of a configuration in which a gate array VLSI and a memory are separated from each other on different chips and the gate array VLSI and the memory are connected to each other via a metal wiring, it is difficult to realize a device where the reconfiguration can be performed at a high speed. For example, in the case where the operating frequency of the reconfigurable device is 100 MHz and the number of all the reconfiguration bits is 100,000 bits, if the reconfigurable device and an external memory are connected to each other via a single wiring, it is necessary to set the transfer speed to 10 Tbps. This transfer speed cannot be realized while the current standard CMOS process is used. Even when various revisions are made on the wiring, the number of usable connection pads in the package is limited to several thousand, and accordingly the speeding up has limitations. Therefore, it cannot be said that the electrical reconfiguration band the reconfigurable device is sufficiently high with respect to the reconfiguration bit number.

On the other hand, for example, processors capable performing the reconfiguration at a high speed such as a DAP/DNA (Digital Application Processor/Distributed Network Architecture) chip and a DRP (dynamically reconfigurable processor) are developed (refer to Non-patent Documents 11 and 12). Each of them is fabricated by packaging a reconfiguration memory and a micro processor on one chip. The reconfiguration memory inside the chip stores a reconfiguration context based on 3 to 16 banks. These banks are switched for each clock. This process is a so-called context switching method. An arithmetic and logic unit (ALU) of these devices can perform the reconfiguration for each clock at intervals of several nano seconds. However, these devices have disadvantages of an extreme difficulty of increasing the reconfiguration memory while the gate density is maintained.

In view of the above, to compensate these disadvantages, new devices are proposed and developed by combining various optical and electrical methods (refer to Non-patent Documents 7 to 10). Among those devices in particular, an optically reconfigurable gate array: hereinafter referred to as "ORGA" (refer to Patent Documents 1 and 2 and Non-patent Documents 1 to 3, and 6) and an optically differential reconfigurable gate array: hereinafter referred to as "ODRGA" (refer to Patent Document 3 and Non-patent Documents 4 and 5) are known which can shorten the reconfiguration time of the conventional FPGA. These devices are similar to the FPGA, but have a difference from the FPGA in that the reconfiguration on the gate array logic configuration is performed with use of optical signal input from an external optical memory. Hereinafter, similar to the ORGA and the ODRGA, devices that can perform the reconfiguration on the logic circuit with use of the optical signal input are generally referred to as "optically reconfigurable logic circuit".

FIG. 18 shows a configuration of an optically reconfigurable logic circuit. An optically reconfigurable logic circuit 100 is composed of an optical part 101 and a VLSI area 102. The optical part 101 is provided with an optical system for irradiating the VLSI area 102 with an optical signal that contains logic circuit configuration information (refer to Patent Documents 1 to 5 and Non-patent Documents 1 to 5).

The optical part 101 is composed of an optical memory element such as a holographic memory or a spatial light modulator that stores the logic circuit configuration information and a light emitting element such as a laser or an LED for outputting irradiation light for reading the logic circuit configuration information from the optical memory element (refer to Patent Documents 2, 4, and 5 and Non-patent Document 2). With use of the light output from the light emitting element, the logic circuit configuration information is read out as an optical signal from the optical memory element.

Mounted to the VLSI area 102 are a configuration information input circuit provided with a light receiving element for detecting an optical signal input from the optical part 101, a logic configuration variable circuit for performing configuration on a logic structure on the basis on the logic circuit configuration information given by the optical signal input to the configuration input information input circuit, an input/output circuit for performing input and output of an external signal with respect to a logic configuration variable circuit, a controller for performing a control on the operation of the optically reconfigurable logic circuit 100 as a whole, and the like are mounted (refer to Patent Documents 1 to 3 and 5).

FIG. 19 shows an example of a configuration information input circuit in a conventional optically reconfigurable logic circuit (refer to Patent Document 3). FIG. 19 illustrates a configuration information input circuit used in an ODRGA. This configuration information input circuit denoted by reference numeral 105 is provided with a photo diode D, a PMOS transistor M, and a T flip-flop (triggered flip-flop: hereinafter referred to as "TFF"). The photo diode D is subjected to reverse direction connection, and an anode is grounded. A cathode of the photo diode D is connected to a power source via the PMOS transistor M. The preset signal nPRESET is input to the gate of the PMOS transistor M (herein, symbol "n" represents a negative logic. In the drawings, the negative logic is indicated by an overline. The same holds true in the following description). The nPRESET is a negative logic, and when the nPRESET is 0, the cathode of the photo diode D is applied with a power source voltage Vc.

A common node N1 for the photo diode D and the PMOS transistor M is connected to a trigger input terminal nT of the TFF. A clock signal (CLOCK) is input to a clock terminal of the TFF, and a clear signal (nCLEAR) is input to a clear terminal nCLR of the TFF. The CLEAR is a negative logic signal. A 1-bit circuit configuration signal (CONFIG) is output from the output terminal Q of the TFF. The circuit configuration signal is a signal representing the logic circuit configuration information of the logic configuration variable circuit.

At the initial rise of CLOCK, when the input of the trigger input terminal nT is 1, the TFF reverses the logic value of the CONFIG, and when the input of the trigger input terminal nT is 0, the TFF keeps the logic value of the CONFIG. In addition, when the nCLEAR is 0, the TFF forcedly sets the CONFIG as 0.

A description will be given to the case in which the reconfiguration is performed on the logic configuration variable circuit.

(1) First of all, the nPRESET is set as 0, and after the power source voltage Vc is applied between the terminals of the photo diode D, the nPRESET is set as 1. As a result, due to a reversed bias junction capacitor of the photo diode D, the node N1 is set at an H level.

(2) Next, an optical signal is input from the optical part 101. Herein, when the photo diode D is irradiated with light, a current flows through the photo diode D. Therefore, a potential of the node N1 is set at an L level. When the photo diode D is not irradiated with light, the node N1 is kept at the H level.

(3) After the input of the optical signal from the optical part 101 is completed, at the initial rise of the CLOCK, when the node N1 is at the L level, the value of the CONFIG is kept, and when the node N1 is at the H level, the value of the CONFIG is reversed. As a result, the logic configuration switching of the logic configuration variable circuit is performed.

The above-mentioned operations (1) to (3) are hereinafter referred to as "refresh".

The above-mentioned configuration is an example of a configuration information input circuit used in the ODRGA. When the configuration is used for the ORGA, instead of the TFF in FIG. 19, a D flip-flop, a latch, a memory, or the like is used.

[Patent Document 1]
Japanese Unexamined Patent Application Publication No. 2002-353317

[Patent Document 2]
U.S. Pat. No. 6,057,703

[Patent Document 3]
Japanese Unexamined Patent Application Publication No. 2004-064017

[Patent Document 4]
U.S. Pat. No. 6,222,755

[Patent Document 5]
U.S. Pat. No. 6,072,608

[Non-patent Document 1]
J. V. Campenhout, H. V. Marck, J. Depreitere, and J. Dambre, "Optoelectronic FPGA's", IEEE J. Sel. Top. Quantum Electronics, Vol. 5, pp. 306-315, 1999.

[Non-patent Document 2]
J. Mumbru, G. Panotopoulos, D. Psaltis, X. An, F. Mok, S. Ay, S. Barna, and E. R. Fossum, "Optically Programmable Gate Array", Proc. SPIE—Int. Soc. Opt. Eng., Vol. 4089, pp. 763-771, 2000.

[Non-patent Document 3]
J. Mumbru, G. Zhou, X. An, W. Liu, G. Panotopoulos, F. Mok, and D. Psaltis, "Optical memory for computing and information processing", Proc. SPIE—Int. Soc. Opt. Eng., Vol. 3804, pp. 14-24, 1999.

[Non-patent Document 4]
M. Watanabe, F. Kobayashi, "An optically differential reconfigurable gate array and its power consumption estimation", IEEE International Conference on Field-Programmable Technology, pp. 197-202, 2002.

[Non-patent Document 5]
M. Watanabe, F. Kobayashi, "An Optically Differential Reconfigurable Gate Array with a dynamic reconfiguration circuit", 10th Reconfigurable Architectures Workshop, p. 188, 2003.

[Non-patent Document 6]
J. Depreitere, H. Neefs, H. V. Marck, J. V. Campenhout, R. Baets, B. Dhoedt, H. Thienpont, and I. Veretennicoff, "An optoelectronic 3-D field programmable gate array", FPL '94. Proc., pp. 352-360, 1994.

[Non-patent Document 7]
Ted H. Szymanski, Martin Saint-Laurent, Victor Tyan, Albert Au, and Boonchuay Supmonchai, "Field-programmable logic devices with optical input-output", Applied Optics, vol. 39, Issue 5, pp. 721-732, February 2000.

[Non-patent Document 8]
Sherif S. Sherif, Stefan K. Griebel, Albert Au, Dennis Hui, Ted H. Szymanski, and H. Scott Hinton, "Field-programmable smart-pixel arrays: design, VLSI implementation, and applications", Applied Optics, Volume 38, Issue 5, pp. 838-846, February 1999.

[Non-patent Document 9]
Majd F. Sakr, Steven P. Levitan, C. Lee Giles, and Donald M. Chiarulli, "Reconfigurable processor employing optical channels", Proceedings of the 1998 International Topical Meeting on Optics in Computing (OC'98), Proceedings of the SPIE, Vol. 3490, pp. 564-567, 1998.

[Non-patent Document 10]
M. Watanabe, J. Ohtsubo, "Digital associative memory neural network with optical learning capability", Optics Communications, Vol. 113, pp. 31-38, 1994.

[Non-patent Document 11]
Hirotaka Nakano, Takeshi Shindo, Tetsuo Kazami, and Masato Motomura, "Development of Dynamically Reconfigurable Processor LSI", NEC TECHNICAL JOURNAL, NEC Corporation, April 2003, Vol. 56, No. 4, pp. 99-102.

[Non-patent Document 12]
U. Tangen, J. S. McCaskill, "Hardware evolution with a massively parallel dynamically reconfigurable computer: POLYP", Evolvable Systems: From Biology to Hardware. Second International Conference, ICES 98 Proc., pp. 364-371, 1998.

DISCLOSURE OF INVENTION

Problems to be Solved by the Invention

According to the conventional optically reconfigurable logic circuit, reconfiguration means for a logic configuration with use of optical input is adopted. For that reason, the VLSI area 102 of the conventional optically reconfigurable logic circuit includes, similarly to the normal FPGA, the logic configuration variable circuit and a large number of configuration information input circuits. In other words, it can be considered that the conventional ORGA or ODRGA is fabricated by adding an optical circuit on a gate array of the FPGA.

The respective configuration information input circuits need a photo diode for detecting the optical logic circuit configuration information, a latch, a flip-flop, or a memory for temporarily storing the logic circuit configuration information, and some transistors.

However, for example, when the mount size of the photo diode in the 0.35 μm process is 25 μm$^2$ and the number of gates is 65 kG, the occupying ratio of the optical circuit in the VLSI chip mount area of the ODRGA is estimated to reach as high as about 47%. In this way, if the occupying ratio of the optical circuit with respect to the mount area is high, a high gate density ORGA or ODRGA cannot be realized.

On the other hand, in the above-mentioned conventional configuration, both sides of the optical part 101 and the VLSI area 102 have a memory function. Therefore, it can be considered that the conventional optically reconfigurable logic circuit has the memory function redundantly as a whole.

The memory function of the VLSI area 102 has an important function of holding the output values of the configuration information input circuits while the photo diodes are refreshed. However, if the memory function of the VLSI area 102 could be eliminated, the mount area of the configuration information input circuits is significantly reduced. As a result, it is considerable that the gate density of the optically reconfigurable logic circuit could be extremely increased.

In view of the above, an object of the present invention is to provide an optically reconfigurable logic circuit capable of reducing an mount area of an optical circuit as much as possible and realizing a high gate density.

Means for Solving the Problems

According to a first aspect of the present invention, an optically reconfigurable logic circuit includes: a configuration information input circuit that includes a photoconductive device for causing continuity/interruption in response to light irradiation input, and converts and outputs an optical signal that contains logic circuit configuration information with use of the photoconductive device into an electric circuit configuration signal; and a logic configuration variable circuit for performing logic configuration of an internal circuit on the basis of the circuit configuration signal, the optically reconfigurable logic circuit being characterized in that a control is performed in such a manner that the logic circuit configuration information input from the optical signal is held at a parasitic capacitance (hereinafter referred to as "input capacitor") between the terminals of the photoconductive device in a non-continuity state as the circuit configuration signal, and as the input capacitor is preset and a next optical signal is input before the held circuit configuration signal disappears due to leak discharge, the logic circuit configuration information is dynamically held at the input capacitor.

According to this configuration, in the case where the writing of the logic circuit configuration information is performed, while the electric charge is charged to the input capacitor structured by the parasitic capacitance of the photoconductive device (which is formed of a junction capacitance of the photoconductive device and other floating capacitance), the optical signal that contains the logic circuit configuration information is input to the optically reconfigurable logic circuit.

At this time, the photoconductive device to which no optical signal is input is kept at the state in which the electric charge of the input capacitor is held. On the other hand, the photoconductive device to which the optical signal is input discharges the electric charge of the input capacitor as the carrier occurs in the depletion layer. As a result, the logic circuit configuration information of the optical signal is converted into the electric charge amount (that is, the inter-terminal voltage of the photoconductive device). Then, after the input of the optical signal, the logic circuit configuration information is held at the input capacitor of the photoconductive device as the electric charge amount (that is, the inter-terminal voltage of the photoconductive device). The inter-terminal voltage of the photoconductive device is output as the circuit configuration signal.

On the basis of the circuit configuration signal, the logic reconfiguration on the logic configuration variable circuit is performed. In general, the input stage of the logic configuration variable circuit has high input impedance, and thus the drop of the inter-terminal voltage of the photoconductive device during a period in which the optical signal is not input is hardly occurred except in the case of the voltage drop due to the leak current. Therefore, the circuit configuration signal is kept stable over a relatively long period of time. The logic configuration variable circuit performs the targeted logic operation processing with use of the logic circuit configured on the basis of the circuit configuration signal while the output value of the configuration information input circuit is not changed.

In this way, according to this configuration, in the configuration information input circuit, without additionally providing a memory circuit such as a latch, a flip-flop, or a memory for holding the logic circuit configuration information, with use of the input capacity formed of the junction capacitance and the floating capacitance of the photoconductive device, the logic circuit configuration information is hold. As a result, excess memory functions are eliminated, the mount area and the electricity consumption of the configuration information input circuit is significantly reduced as compared with the prior art.

Then, before the circuit configuration information held at the input capacitor disappears due to the leak discharge, the input capacitor is preset and refreshed by the next input of the optical signal. For that reason, the circuit configuration information of the input capacitor can keep being dynamically held continuously.

Herein, for "the photoconductive device", a photo diode, a photo transistor, a photoconductive cell, or the like can be used. It should be noted that "the logic circuit configuration information is dynamically held" means keeping the state in which the logic circuit configuration information is periodically refreshed, thereby holding the logic circuit configuration information.

According to a second aspect of the present invention, in the first aspect, the optically reconfigurable logic circuit is characterized in that the photoconductive device is a photo diode subjected to reverse bias connection.

According to this configuration, the photo diode is used as the photoconductive device and the mount area can be further reduced, whereby the optically reconfigurable logic circuit can be set to have high gate number as much as possible.

Herein, for "the photo diode", a PN photo diode, a PIN photo diode, a Schottky photo diode, an Avalanche photo diode or the like can be use. In particular, it is effective to use the PN photo diode for simplifying the manufacturing process and reducing the mount area.

According to a third aspect of the present invention, in the first or second aspect, the optically reconfigurable logic circuit is characterized in that the configuration information input circuit includes a logic output circuit for quantizing an inter-terminal voltage of the photoconductive device and outputting the resultant as a logic output value, and the logic output circuit quantizes an electric signal which is output when the photoconductive device converts the optical signal, and outputs the resultant as the circuit configuration signal.

According to this configuration, the output of the photoconductive device is quantified with use of the logic output circuit, whereby it is possible to output the stable signal as the circuit configuration signal.

Herein, for "the logic output circuit", a CMIS (Complementary Metal Insulator Semiconductor) inverter circuit, a comparison circuit, or the like can be used. In view of making the mount area small, use of the CMIS inverter circuit is preferable.

According to a fourth aspect of the present invention, in any one of the first to third aspects, the optically reconfigurable logic circuit is characterized by further including preset control means for performing a preset control for charging the input capacitor by applying the photoconductive device with a preset voltage in a reverse bias direction; irradiation light control means for performing irradiation control for writing logic circuit configuration information to the configuration information input circuit by setting the optical signal in an on state in a predetermined period of time and causing continuity of the irradiated photoconductive device on the basis of the optical signal after the input capacitor is charged through the preset control; and timing generation means for outputting a preset timing signal to the preset control means with a predetermined delay time after the logic circuit configuration information is written to the configuration information input circuit through the irradiation light control, the optically reconfigurable logic circuit characterized in that the preset control means executes the preset control when the preset timing signal is input.

According to this configuration, in the case where the logic circuit configuration information held by the configuration information input circuit is updated, first of all, the preset control means applies the preset voltage between the electrodes of the photoconductive device in the reverse bias. As a result, the input capacitor formed of the parasitic capacitance of the photoconductive device is charged with the electric charge. Next, the preset control means stops the application of the preset voltage. Then, the light irradiation control means performs such a control that the optical signal that contains the logic circuit configuration information is input to the optically reconfigurable logic circuit. As a result, the update of the logic circuit configuration information held at the configuration information input circuit can be conducted. It should be noted that the series of the logic circuit configuration information update operations is referred to as "refresh".

As described above, the drop of the inter-terminal voltage of the photoconductive device during a period in which the optical signal is not input hardly occurs expect in the case of the voltage drop due to the leak current. Therefore, the circuit configuration signal can be kept stable over a relatively long period. The preset control means and the light irradiation control means performs the refresh before the voltage between terminals of the input capacitor falls to be equal to or lower than the logic threshold of the logic output circuit due to the leak current, and therefore the logic circuit configuration information is continuously held at the configuration information input circuit. The logic configuration variable circuit performs the targeted logic operation processing during a period from the update of the logic circuit configuration information to the update of the next logic circuit configuration information.

In this way, according to this configuration, by dynamically updating the logic circuit configuration information of the configuration information input circuit with use of the preset control means and the light irradiation control means, it is possible to prevent such a situation that the logic configuration of the logic configuration variable circuit becomes undetermined unexpectedly due to the disappearance of the logic circuit configuration information due to the leak discharge.

Herein, "the predetermined delay time" in which the timing generation means outputs the preset timing signal is appropriately set to a time shorter than the time interval after the input of the optical signal before the disappearance of the circuit configuration information of the input capacitor due to the leak discharge.

According to a fifth aspect of the present invention, in the fourth aspect, the optically reconfigurable logic circuit is characterized in that the timing generation means outputs a preset timing signal to the preset control means with a delay time shorter than a period in which the inter-terminal voltage of the photoconductive device that is previously set to the preset voltage through the preset control falls to be equal or lower than a predetermined logic threshold due to the leak discharge.

In this way, during a period after the preset before the drop of the inter-terminal voltage of the photoconductive device to be equal to or lower than the predetermined logic threshold, as the timing generation means outputs the preset signal to the preset control means again, the update of the circuit configuration information of the input capacitor is executed. As a result, the circuit configuration information of the input capacitor can be dynamically held.

Herein, "the predetermined logic threshold" is a logic threshold voltage determined by a semiconductor circuit structuring the optically reconfigurable logic circuit.

According to a sixth aspect of the present invention, in the fourth or fifth aspect, the optically reconfigurable logic circuit is characterized in that the configuration information input circuit includes a preset switching element for performing turning on/off of the preset voltage applied between electrodes of the photoconductive device, and the preset control means asserts in a predetermined period the preset signal for turning on the preset switching element.

According to this configuration, while the preset switching element is turned on in response to the preset signal, the application of the preset voltage is applied between the electrodes of the photoconductive device, and the input capacitor is preset. After that, the input signal is irradiated and input to the photoconductive device, thereby making it possible to write the circuit configuration information to the input capacitor.

Herein, for "the preset switching element", a switching element such as a MISFET (Metal Insulator Semiconductor Field Effect Transistor) or a bipolar transistor can be used. In addition, the preset switching element can be connected to the anode or the cathode with respect to the photoconductive device. In addition, "the predetermined period" for asserting the preset signal is to a sufficient period of time in which the voltage of the input capacitor saturates to the preset voltage.

According to a seventh aspect of the present invention, in any one of the third to fifth aspects, the optically reconfigurable logic circuit is characterized by further including logic output holding means for holding a logic output value of the logic configuration variable circuit at a timing before a time point when the inter-terminal voltage of the photoconductive device falls to be equal to or lower than the predetermined logic threshold as the input capacitor charged to the preset voltage through the preset control involves leak discharge.

According to this configuration, during the period of the logic circuit configuration information of the configuration information input circuit, the output signal of the logic configuration variable circuit is temporarily held by the external output memory means. Therefore, even when the logic structure of the internal circuit of the logic configuration variable circuit becomes undetermined during the update of the logic circuit configuration information, it is possible to prevent the situation in which the logic output value of the logic configuration variable circuit becomes undetermined.

In the case of additionally providing the logic output holding means, the additional mount area is accordingly necessary. However, in general, all the logic circuit configuration information of the logic configuration variable circuit is significantly lower than the number of all the bits. Therefore, as compared with the conventional case in which memory elements are mounted corresponding to all the photoconductive devices, the mount area can be considerably reduced.

Herein, for "the logic output holding means", a memory element that is usually used such as a latch, a flip-flop, or a register can be used.

According to an eighth aspect of the present invention, in the seventh aspect, the optically reconfigurable logic circuit is characterized in that the configuration information input circuit includes a preset switching element for performing turning on/off of a preset voltage that is applied between the electrodes of the photoconductive device, the preset control means asserts in a predetermined period the preset signal for turning on the preset switching element, and the logic output holding means holds the logic output value of the logic configuration variable circuit at a timing before the preset control means asserts the preset signal.

According to this configuration, as the logic output holding means holds the logic output value of the logic configuration variable circuit before the input capacitor is preset by the preset after the circuit configuration information is held at the input capacitor, while the circuit configuration information of the input capacitor is updated, the previous circuit configuration information is held and the logic configuration of the logic configuration variable circuit is maintained. Therefore, the logic structure of the internal circuit of the logic configuration variable circuit becomes undetermined while the logic circuit configuration information is updated, and it is possible to prevent the situation in which the logic output value of the logic configuration variable circuit becomes undetermined.

According to a ninth aspect of the present invention, in any one of fourth to sixth aspects, the optically reconfigurable logic circuit is characterized by further including a pass transistor for causing continuity/interruption of a circuit configuration signal transmission line for inputting the circuit configuration signal, which is output from the configuration information input circuit, to the logic configuration variable circuit; and pass transistor control means for performing such a control that the circuit configuration signal is held at one of the circuit configuration signal transmission line and a parasitic capacitance (hereinafter referred to as "output capacitor") of an input circuit of the logic configuration variable circuit to which the circuit configuration signal transmission line is connected as the pass transistor is set in the interruption state during the irradiation of the optical signal.

According to this configuration, during a period in which the update of the circuit configuration information of the input capacitor is conducted in response to the preset and the irradiation of the optical signal (hereinafter referred to as "refresh period"), by holding the circuit configuration signal at the output capacitor, even during the refresh period, the logic configuration of the logic configuration variable circuit is kept and the execution can be performed.

Also, the parasitic capacitance of the circuit configuration signal transmission line or the input circuit of the logic configuration variable circuit to which the circuit configuration signal transmission line is connected is used for the output capacitor, and thus an element added to the configuration information input circuit is only a pass transistor, thereby achieving the small mount area and high gate number.

According to a tenth aspect of the present invention, in the eighth aspect, the optically reconfigurable logic circuit is characterized in that the pass transistor control means performs such a control that, after irradiation of the optical signal, as the input capacitor charged to the preset voltage through the preset control involves leak discharge, before a time point when the inter-terminal voltage of the photoconductive device falls to be equal or lower than the predetermined logic threshold, at least during a period in which logic reconfiguration on the logic configuration variable circuit is completed, the pass transistor is set in the continuity state, and during the irradiation of the optical signal, the pass transistor is set in the interrupted state.

As a result, the logic configuration of the logic configuration variable circuit is guarantied with certainty on the basis of the circuit configuration information held at the input capacitor.

According to an eleventh aspect of the present invention, in any one of fourth to tenth aspects, the optically reconfigurable logic circuit further includes the optical signal input means for irradiating the configuration information input circuit with the optical signal that contains the logic circuit configuration information, and is characterized in that the light irradiation control means controls turning on/off for the selection and irradiation of the optical signal output from the optical signal input means.

According to this configuration, the optical signal input means performs the operation for repeating the update of the logic circuit configuration information while performing the selection of the optical signal, and can realize the optically reconfigurable logic circuit in which the logical configuration is dynamically changed.

According to a twelfth aspect of the present invention, in the eleventh aspect, the optically reconfigurable logic circuit is characterized in that at least two of the logic configuration variable circuits are connected in parallel to each other with a common input/output terminal for a logic variable, the optical signal input means can independently input an optical signal that contains the logic circuit configuration information to the configuration information input circuits corresponding to the respective logic configuration variable circuit, and the optical signal input means includes open collector circuits provided at output stages of the logic configuration variable circuits and reconfiguration control means for performing such a control on the optical signal input means that switching is performed among the logic configuration variable circuits connected in parallel to each other so that at the same time point, the configuration information input circuit corresponding to at least one of the logic configuration variable circuits is not irradiated with the optical signal and optical signals that contain the same logic circuit configuration information are input to the logic configuration variable circuits.

According to this configuration, reconfiguration can be conducted for the respective logic configuration variable circuits. Therefore, each of the logic configuration variable circuits connected in parallel has the identical circuit configuration. Then, when reconfiguration is conducted on the logic configuration variable circuits, among the logic configuration variable circuits connected in parallel, while at least one of the logic circuit configurations is kept, reconfiguration is conducted on the other logic configuration variable circuits. At this time, the output stages of the respective logic configuration variable circuits are open collector circuits, and thus the output value of the logic configuration variable circuit in which the logic circuit configuration is kept is output to the output terminal. Therefore, while the logic circuit inside the logic configuration variable circuit is reconfigured, it is possible to prevent such a situation that the output value of the logic configuration variable circuit becomes undetermined.

According to the sixth aspect of the present invention, in any one of the first to fifth aspects, the optically reconfigurable logic circuit is characterized in that the photoconductive device is the photo diode in the reverse bias, and the configuration information input circuit holds the logic circuit configuration information as electric charge with use of the input capacitor formed of the junction capacitance and the floating capacitance of the photo diode.

According to this configuration, as the photo diode is used for the photoconductive device, the mount area of the photoconductive device is particularly made small, and the mount area of the configuration information input circuit can be reduced.

EFFECT OF THE INVENTION

As described above, according to the present invention, in the configuration information input circuit, such a configuration is adopted that the logic circuit configuration information is held with use of the input capacitor formed of the junction capacitance and the floating capacitance of the photoconductive device, the mount area and power consumption of the configuration information input circuit can be significantly reduced as compared with the prior art. As a result, the mount area of the optical circuit is reduced, and it is possible to realize the high gate density.

BRIEF DESCRIPTION OF THE DRAWINGS

FIG. 13 (a) is for the configuration information input circuit in FIG. 5(a), and FIG. 13 (b) is for the configuration information input circuit according to the third embodiment.

REFERENCE NUMERALS

| | |
|---|---|
| 1, 1' | optically reconfigurable logic circuit |
| 2 | optical section |
| 3 | VLSI section |
| 4 | optical memory |
| 5 | light irradiation section |
| 6, 6b | configuration information input circuit |
| 6a | optical reconfiguration instruction circuit |
| 7, 7', 7a, 7b | logic configuration variable circuit |
| 8, 9 | input/output circuit |
| 10 | output holding circuit |
| 11 | preset control section |
| 12 | irradiation light control section |
| 13 | timer |
| 14 | I/O block |
| 15 | logic block |
| 16 | switching matrix |
| 16a | connection switching circuit |
| 16b | analog switch |
| 17 | connection wiring |
| 18 | input variant selection circuit |
| 19 | lookup table |
| 19a | multiplexer |
| 20 | D flip-flop (DFF) |
| 21 | output variant selection circuit |
| 22 | output wiring selection circuit |
| 22a | tristate buffer |
| 23 | clear signal selection circuit |
| 25 | D flip-flop (DFF) |
| 26 | transmission gate |
| 27 | latch |
| 30 | output circuit |
| 31 | open collector circuit |
| 40 | pass transistor control section |
| 41 | input buffer |
| 42 | circuit configuration signal transmission line |
| 43 | logic output circuit with pass transistor |
| P | photo diode |
| M | preset switching element |
| M2 | pass transistor |
| DIG | logic output circuit |
| C | input capacitor |
| C' | output capacitor |

BEST MODE FOR CARRYING OUT THE INVENTION

Hereinafter, a description will be given to a best mode for implementing the present invention with reference to the drawings.

First Embodiment

Figure 1:
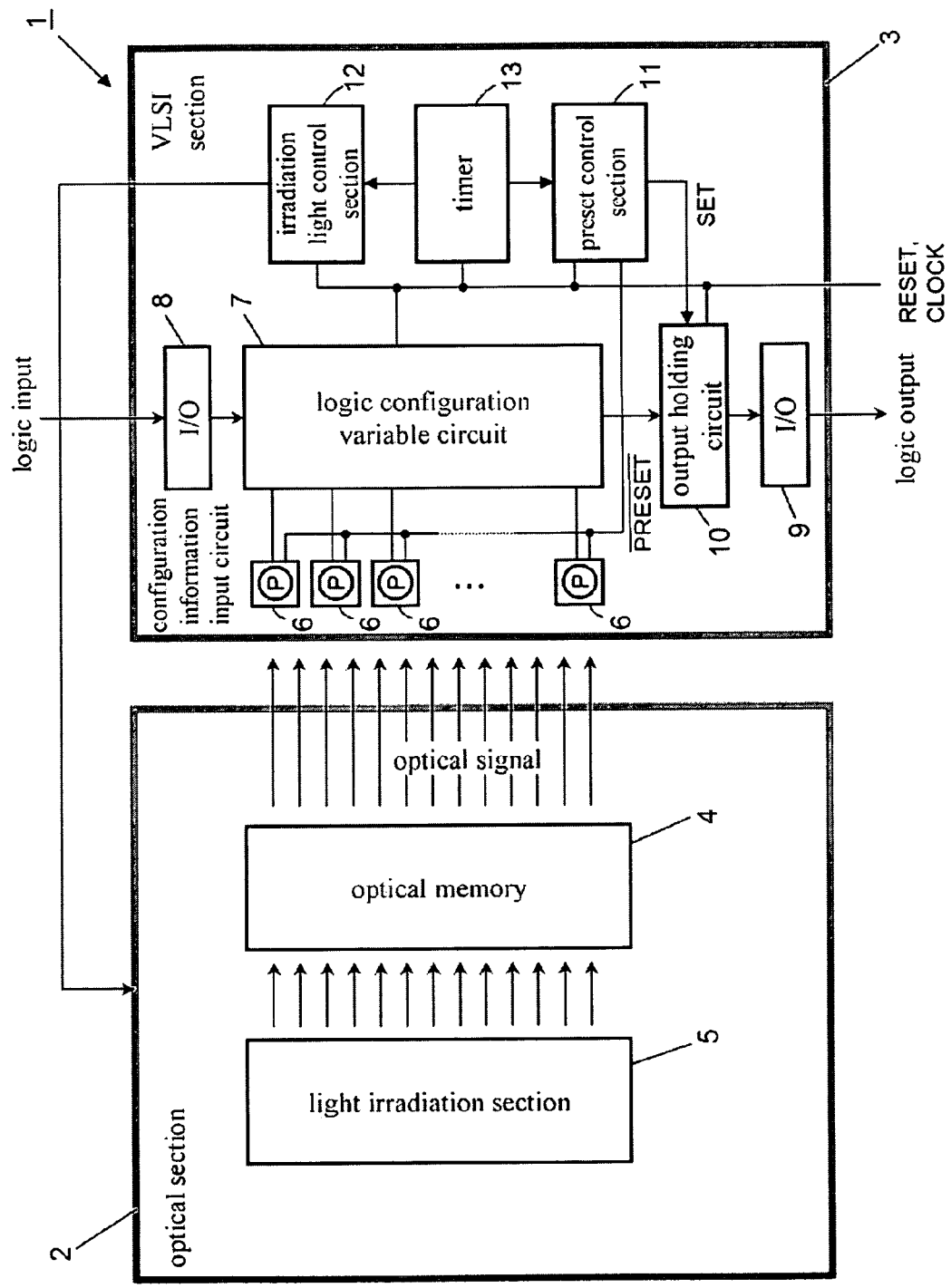
[FIG. 1] A block diagram of a function configuration of an entirety of an optically reconfigurable logic circuit according to a first embodiment of the present invention.

FIG. 1 is a block diagram of a function configuration of an entirety of an optically reconfigurable logic circuit according to a first embodiment of the present invention. An optically reconfigurable logic circuit 1 is provided with an optical section 2 (optical signal input means) and a VLSI section 3. The optical section 2 is a section for output logic circuit configuration information as an optical signal. The VLSI section 3 is a section for constructing a logic configuration of an internal circuit and performing an arithmetic processing on the basis of the logic circuit configuration information that is contained in the optical signal input from the optical section 2.

The optical section 2 is provided with an optical memory 4 and a light irradiation section 5. The optical memory 4 is a memory for optically storing the logic circuit configuration information. The light irradiation section 5 is provided with a light emitting element for emitting light for reading out the logic circuit configuration information stored in the optical memory 4. The light emitted from light irradiation section 5 (hereinafter referred to as "the reference light") functions as an optical signal that is pattern light that is irradiated through the optical memory 4 and includes the logic circuit configuration information. The VLSI section 3 is irradiated with this optical signal.

For the optical memory 4, a hologram memory, a spatial light modulator (a liquid spatial light modulator or the like) etc. are used. For the light irradiation section 5, a semiconductor laser array and the like are used. By changing the angle of the reference light emitted from the light irradiation section 5 to the optical memory 4 or specially changing of an optical modulation characteristic the optical memory 4, the logic circuit configuration information read out from the optical memory 4 is switched.

It should be noted that with regard to the optical section 2, various similar members described in Patent Documents 2, 4, and 5, etc. are known up to now, so a detailed description will be omitted here.

The VLSI section 3 includes a plurality of configuration information input circuits 6, a logic configuration variable circuit 7, input/output circuits 8 and 9, an output holding circuit 10, a preset control section 11, an irradiation light control section 12, and a timer 13. These parts are mounted on one VLSI chip.

The configuration information input circuit 6 is provided with a photo diode P that is one type of a photoconductive device. As will be described later, the photo diode P is subjected to reverse direction connection and functions as a capacitor (hereinafter referred to as "input capacitor") C formed of a parasitic capacitance (the junction capacitance and the floating capacitance). The configuration information input circuit 6 is adapted to convert the optical signal emitted from the optical section 2 into an electric signal with use of the photo diode P. In addition, configuration information input circuit 6 temporarily holds the electric signal that contains the logic circuit configuration information and outputs the signal as a voltage signal. At this time, the logic circuit configuration information is held in the input capacitor C of the photo diode P as the electric charge amount. Then, with use of a logic output circuit DIG at the high input impedance (refer to FIG. 5), the inter-terminal voltage of the photo diode P is converted into binary data and output.

The logic configuration variable circuit 7 performs the internal logic circuit configuration on the basis of the logic circuit configuration information output from the respective configuration information input circuits 6. Then, with the thus configured logic circuit, the logic configuration variable circuit 7 executes a logic arithmetic processing.

It should be noted that in FIG. 1, for the convenience for describing the functional configuration, the respective configuration information input circuits 6 and the logic configuration variable circuit 7 are separated from each other for description, but physically, as will be described later, the respective configuration information input circuits 6 are dispersed and incorporated at parts of the logic configuration variable circuit 7.

The input/output circuits 8 and 9 are interfaces for controlling the input of the logic variable from the external circuit to the VLSI section 3 and the output of the logic variable from the VLSI section 3 to the external circuit.

The output holding circuit 10 is a circuit for temporally holding the output of the logic configuration variable circuit 7 while the reconfiguration of the logic of the logic configuration variable circuit 7.

The preset control section 11 irregularly and intermittently outputs the preset signal nPRESET for performing the preset on the respective configuration information input circuits 6. It should be noted that the time interval in which the preset control section 11 outputs the preset signal nPRESET is set to a shorter time in which at least the electric charge charged to the input capacitor C of the photo diode P discharges due to the leak current (leak discharge) and the inter-terminal voltage of the photo diode P becomes equal to or lower than the logic threshold of the logic output circuit DIG. The time for outputting the preset signal nPRESET is set to about a saturation time of the input capacitor C of the photo diode P of the respective configuration information input circuits 6. These times are measured by the timer 13 (timing generation means). In other words, the timer 13 measures the time for performing the preset and periodically outputs the preset timing signal to the preset control section 11. The preset control section 11 outputs the preset signal nPRESET on the basis of this preset timing signal.

Usually, the attenuation time in which the inter-signal voltage of the photo diode P reduces due to the leak discharge is set to a long time of about several tens milliseconds. Therefore, the time interval in which the preset control section 11 outputs the preset signal nPRESET can be set to a sufficiently long time interval as compared with the time in which the logic configuration variable circuit 7 performs the logic arithmetic processing on one task.

After the preset control section 11 completes outputting the preset signal nPRESET, the irradiation light control section 12 performs the control on the optical section 2 such that the light irradiation section 5 of the optical section 2 outputs the optical signal only for a predetermined time.

Figure 2:
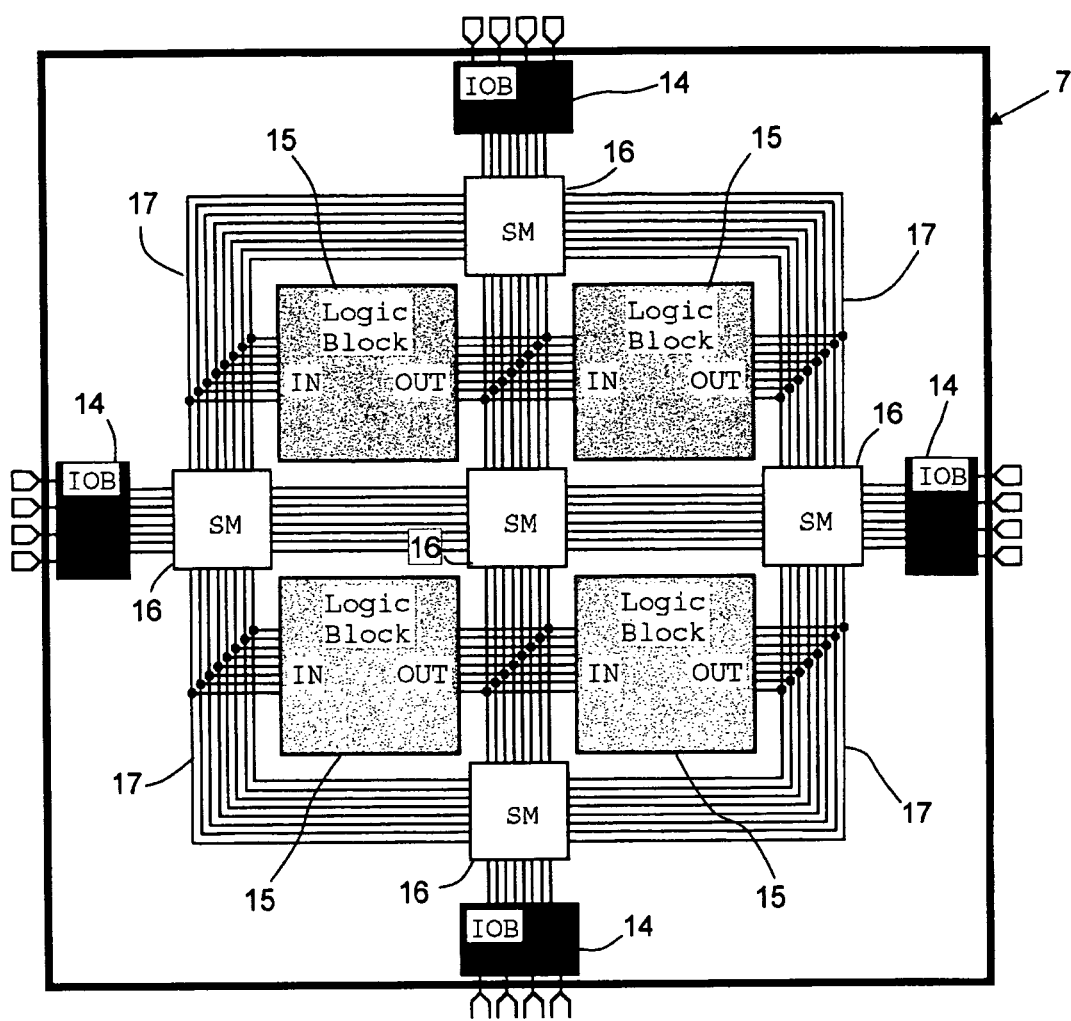
[FIG. 2] A circuit diagram of a configuration example of a logic configuration variable circuit.

FIG. 2 is a circuit diagram of an example of the logic configuration variable circuit 7A. The logic configuration variable circuit 7 includes the general FPGA except the input area of the logic circuit configuration information. The logic configuration variable circuit 7 includes four I/O blocks 14, four logic blocks 15, five switching matrices 16, and connection wirings 17. At parts inside the respective logic blocks 15 and the respective switching matrices 16, the configuration information input circuits 6 are incorporated.

The four I/O blocks 14 are circuits for distributing to connection wirings 17 the input variants with respect to the logic configuration variable circuit 7 and performing the signal distribution for outputting the output variants of the logic configuration variable circuit 7 to the external output lines.

The four logic blocks 15 are located at apexes of the respective rectangles. The logic blocks 15 is a logic arithmetic processing circuit for performing the configuration on the logic structure on the basis of the logic circuit configuration information output from the configuration information input circuits 6.

The respective switching matrices 16 are located at midpoints of four sides of a rectangle surrounding the four logic blocks 15 and the center of the rectangle. In addition, among the respective switching matrices 16, among the respective switching matrices 16 and the respective logic blocks 15, and among the respective logic blocks 15, connections are achieved by a plurality of connection wirings 17. The switching matrices 16 are switching circuits for performing the switching on the connection direction of the connection wirings 17 on the basis of the logic circuit configuration information output from the configuration information input circuits 6.

Moreover, the four I/O blocks 14 are provided corresponding to the four switching matrices 16 located at located at midpoints of four sides of a rectangle surrounding the four logic blocks 15. The four switching matrices 16 are connected to the corresponding I/O blocks 14 via the plurality of connection wirings 17. Then, via the I/O blocks 14 performs the input and output of the logic variable with respect to the external circuit.

Figure 3:
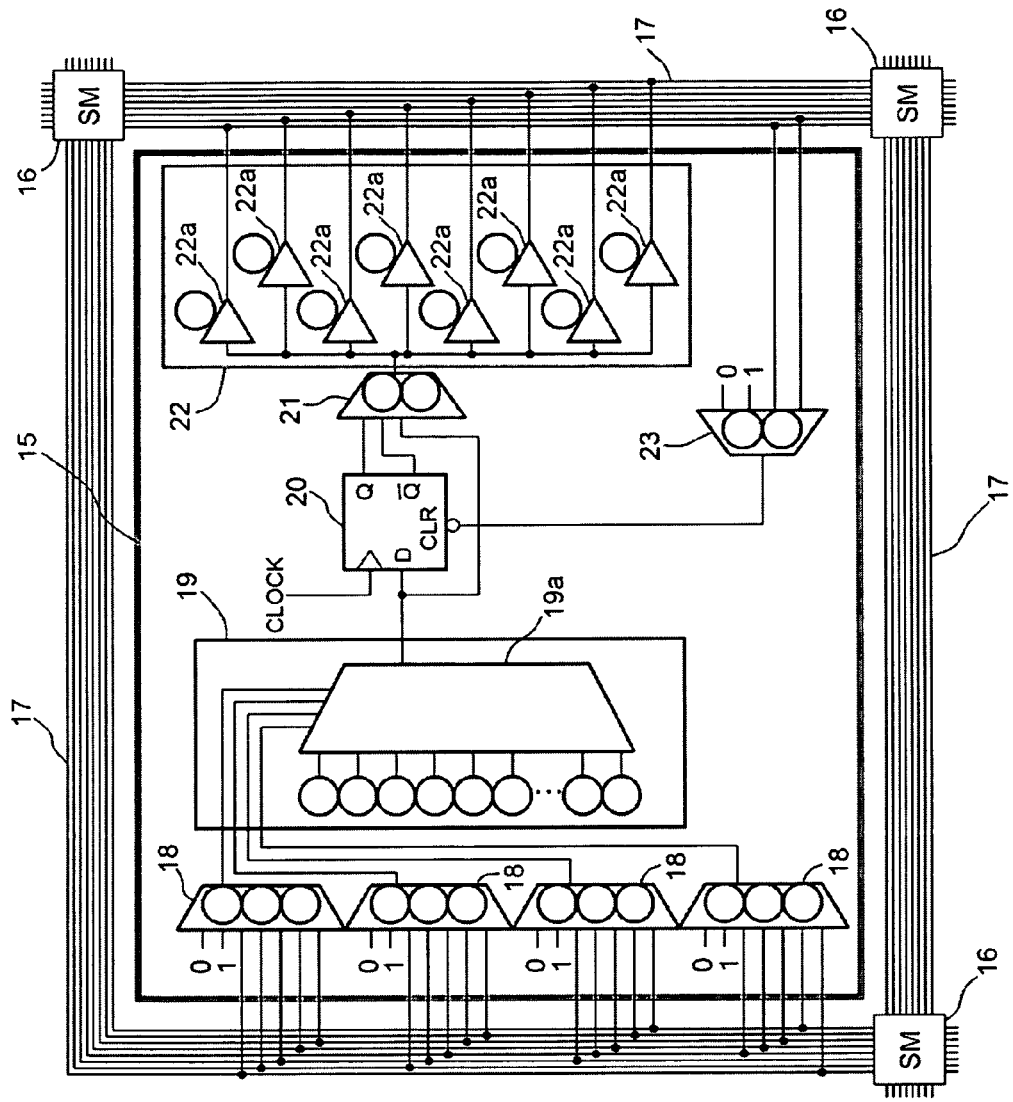
[FIG. 3] A diagram of a configuration example of the logic block in FIG. 2.

FIG. 3 is a diagram of an example of a configuration the logic block 15 in FIG. 2. The logic block 15 shown in this example includes four input variant selection circuits 18, a lookup table 19, a D flip-flop (hereinafter referred to as "DFF") 20, an output variant selection circuit 21, eight output wiring selection circuits 22, and a clear signal selection circuit 23.

The respective input variant selection circuits 18 is composed of five input lines which are different from each other and connected to the connection wirings 17, two input lines to which logic 0 and logic 1 are input, and a multiplexer for selecting one of these input lines. The input variant selection circuit 18 is provided with the three configuration information input circuits 6. The one bit logic circuit configuration information is output from the respective configuration information input circuits 6. The input variant selection circuit 18 selects one of the seven input lines on the basis of the logic circuit configuration information that is output from the respective configuration information input circuits 6. The logic value input from the selected input line is output to the output line.

The lookup table 19 selects and outputs one of 16 bit selected signals on the basis of the four bit selection signal input from the four input variant selection circuits 18. The lookup table 19 includes 16 configuration information input circuits 6 and a multiplexer 19a for selecting one of outputs of the respective configuration information input circuits 6. The 16 configuration information input circuits 6 respectively output selected signals. The multiplexer 19a performs the selection on the selected signals on the basis of the four bit selection signal that is input from the input variant selection circuit 18.

The DFF 20 temporally holds the output value of the lookup table 19. The output value of the lookup table 19 is input to an input terminal D of the DFF 20. At the initial rise of a clock CLK that is input from the clock terminal, the DFF 20 takes in and stores the output value of the lookup table 19. The DFF 20 outputs the held logic value from the output terminal Q. Then, the reverse value is output from the output terminal nQ.

The output variant selection circuit 21 is composed of a 3-input and 1-output multiplexer. Two of the input terminals of the output variant selection circuit 21 are connected to the output terminals Q and nQ of the DFF 20. The remaining one input terminal of the output variant selection circuit 21 bypasses the DFF 20 and is directly connected to the output terminal of the lookup table 19. The output variant selection circuit 21 incorporates the two configuration information input circuits 6. Then, on the basis of the two bit logic circuit configuration information that is output from the two configuration information input circuits 6, the output variant selection circuit 21 selects one of the inputs from the three input terminals and outputs the input to the output terminal.

The output value of the clear signal selection circuit 23 is input to the clear terminal CLR of the DFF 20. The clear signal selection circuit 23 is composed of 4-input and 1-output multiplexer. Two of the input terminals of the clear signal selection circuit 23 are connected to different connection wirings 17. The logic 0 and the logic 1 are input to the remaining two of the input terminals of the clear signal selection circuit 23. The clear signal selection circuit 23 incorporates the two configuration information input circuits 6. Then, on the basis of the two logic circuit configuration information that is output from the two configuration information input circuits 6, the clear signal selection circuit 23 selects one input from the four input terminals and output the input to the output terminal.

The eight output wiring selection circuit 22 is provided with a plurality of tristate buffers (tri-state buffer) 22a corresponding to the connection wirings 17 on one on one basis. In addition, the configuration information input circuits 6 are provided corresponding to the tristate buffers 22a on one on one basis. The outputs from the respective configuration information input circuits 6 are input to corresponding strobe input terminals of the tristate buffers 22a. The output variant of the output variant selection circuit 21 is output to the data input terminals of the respective tristate buffers 22a. The data output terminals of the respective tristate buffers 22a are connected to the corresponding connection wirings 17.

Figure 4:
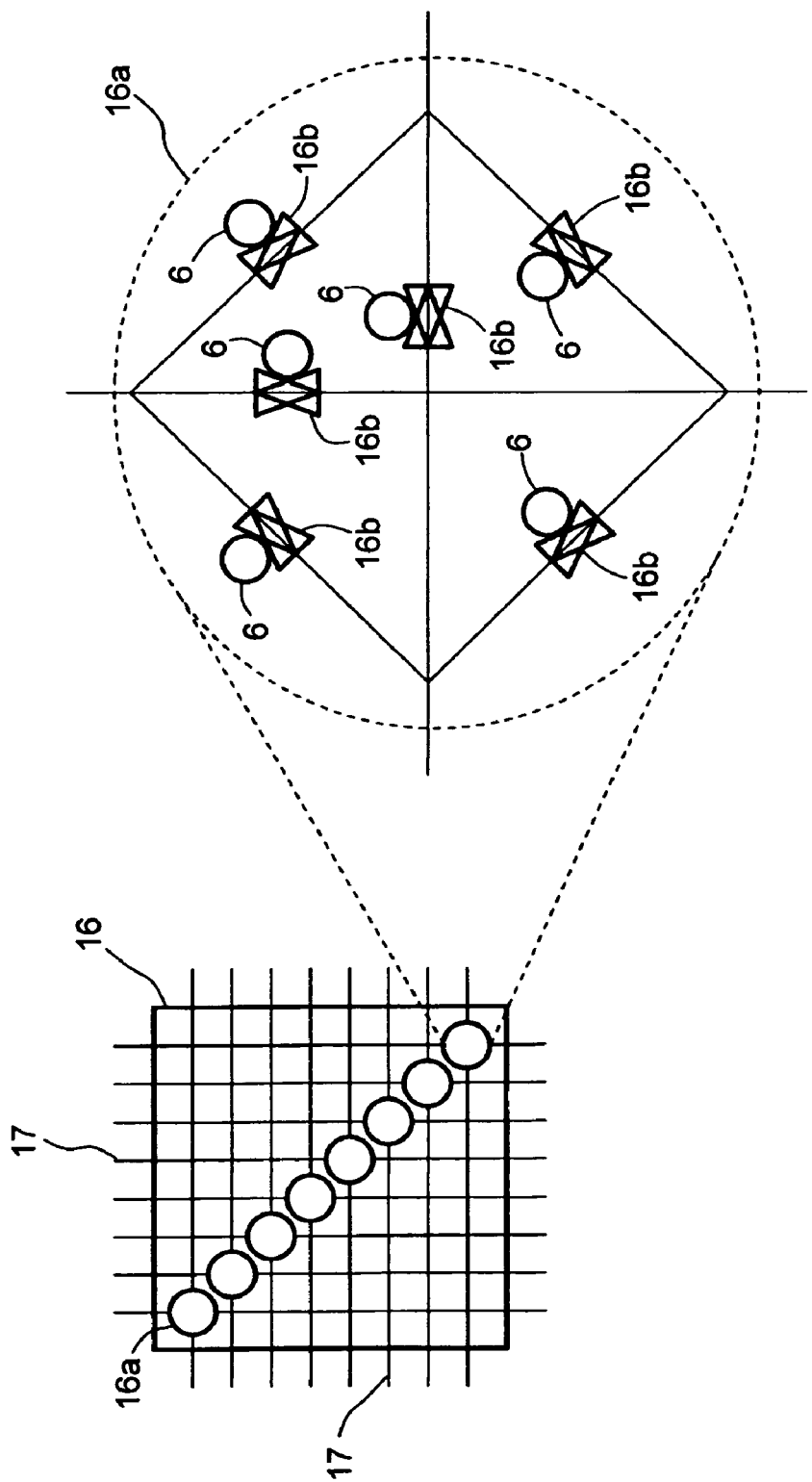
[FIG. 4] A diagram of a configuration example of the switching matrix in FIG. 2.

FIG. 4 is a diagram of a configuration example of the switching matrix 16 in FIG. 2. The switching matrices 16 are provided at intersections of the connection wirings 17. At the intersections of the connection wirings 17, connection switching circuits 16a including six analog switches 16b are provided. As a result, the four connection wirings 17 connected to the connection switching circuit 16a are divided into groups with arbitrary two wirings, and the connection wirings 17 in the same group can be connected to each other.

The configuration information input circuits 6 are provided corresponding to the respective analog switches 16b on one on one basis. In response to the outputs from the respective configuration information input circuits 6, turning on/off of the corresponding analog switches 16b is performed.

As described above, in this embodiment, the respective logic blocks 15 and the respective switching matrices 16 connected by the connection wirings 17 form the logic configuration variable circuits 7. Then, by inputting the optical signal to the configuration information input circuits 6 incorporated in these circuits, the logic configuration of the logic configuration variable circuit 7 can be changed.

Figure 5:
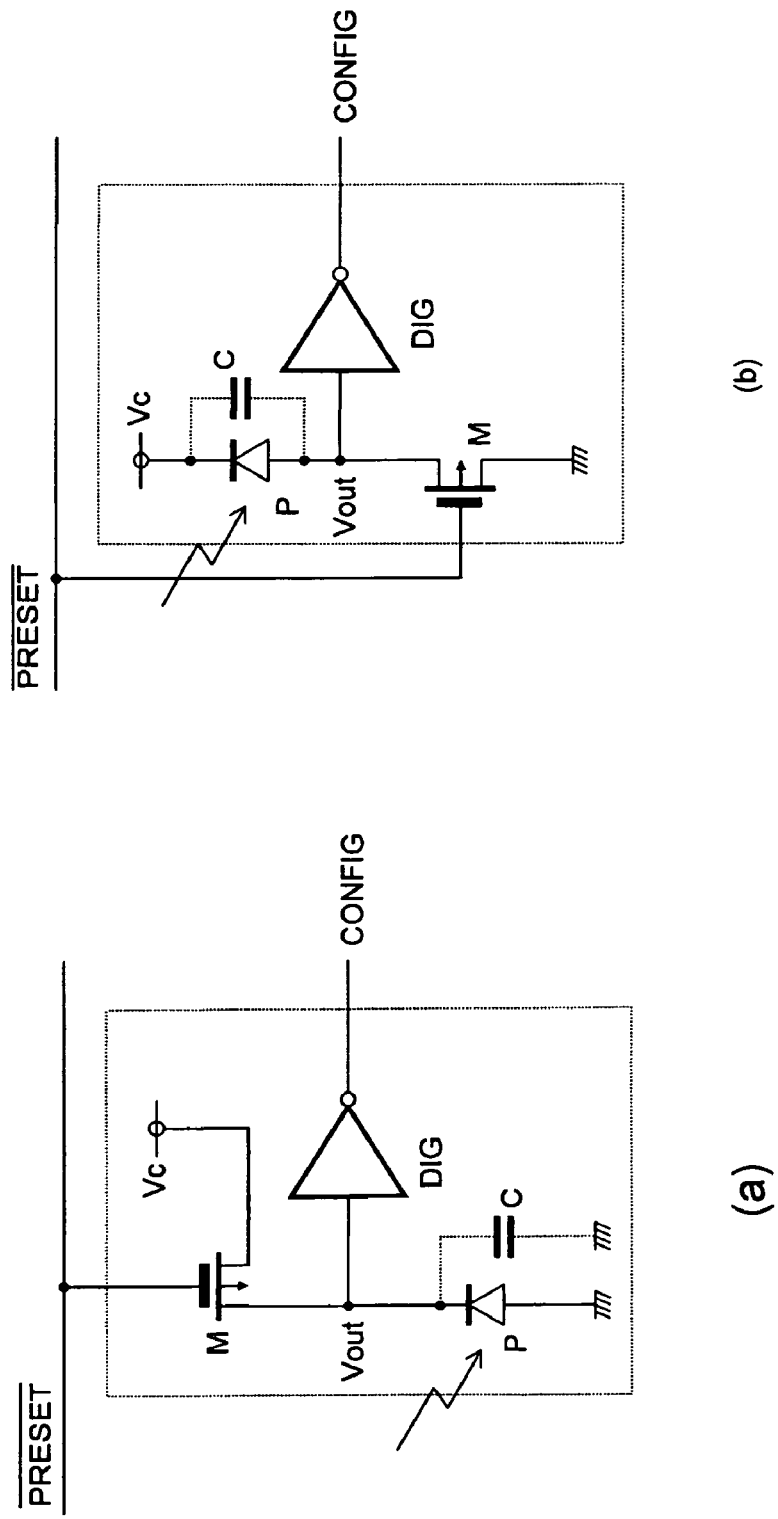
[FIG. 5] A circuit diagram of a configuration example of the information input circuit.

FIG. 5 is a circuit diagram of a configuration example of the configuration information input circuit 6.

The configuration information input circuit 6 in FIG. 5(a) is provided with the photo diode P, a preset switching element M, and the logic output circuit DIG. In this embodiment, a PN photo diode is used for the photo diode P. The photo diode P is subjected to reverse direction connection. An anode of the photo diode P is grounded, and a cathode thereof is connected to a power supply via the preset switching element M. When no light is irradiated, the photo diode P functions as the input capacitor C formed of the junction capacitance and the floating capacitance.

The preset switching element M is a normal PMOS transistor. The preset signal nPRESET from the preset control section 11 is input to a gate of the preset switching element M. The nPRESET is a negative logic. When the nPRESET is 0, the cathode of the photo diode P is applied with power supply voltage (the preset voltage) Vc. If no light is irradiated, in the case of application of the power source voltage Vc, the input capacitor C of the photo diode P is charged. When the nPRESET is 1, the cathode of the photo diode P and the power supply are separated from each other.

The logic output circuit DIG is a circuit for comparing the cathode voltage of the photo diode P (that is, the inter-terminal voltage of the photo diode P) with a predetermined threshold and outputting the voltage after converted into binary data. The threshold voltage is usually set to about half of the power source voltage Vc. In the example of FIG. 5(a), a normal inverter circuit is used for the logic output circuit DIG. The output of the logic output circuit DIG is output to the respective parts in the logic configuration variable circuit 7 as the circuit configuration signal CONFIG.

Figure 6:
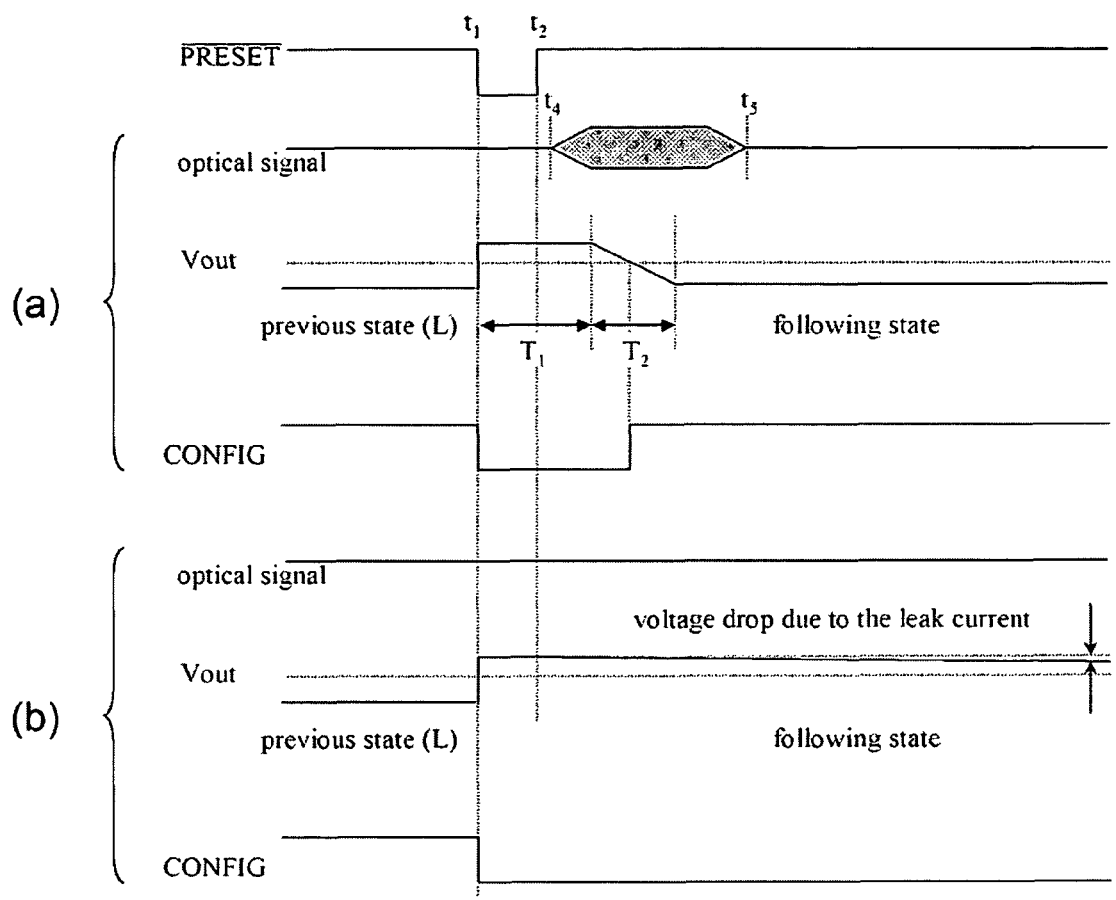
[FIG. 6] A timing drawing of operations of the configuration information input circuit.

The operation of this circuit will be briefly described with reference to FIG. 6. FIG. 6(a) is for the case in which after the preset, the optical signal is input to the configuration information input circuit 6 and FIG. 6(b) is for the case in which after the preset, no optical signal is input to the configuration information input circuit 6.

When the preset signal nPRESET is asserted at a time $t_1$, the preset switching element M is turned on. Along with this, the photo diode P is subjected to the reverse bias, and the junction capacitance becomes larger due to the enlargement of the depletion layer. Then, the input capacitor C is charged through the preset switching element M, an anode voltage Vout of the photo diode P is set to the power source voltage Vc. At this time, a circuit configuration signal CONFIG that is output from the logic output circuit DIG is preset to 0. Then, at a time $t_2$, the preset signal nPRESET is negated, and the cathode of the photo diode P and the power supply are separated from each other.

Next, in FIG. 6(a), from a time $t_4$ to a time $t_5$, the optical signal is input to the configuration information input circuit 6. As a result, a current flows from the cathode of the photo diode P to the cathode and the input capacitor C performs the discharge. Then, in the end, the cathode voltage Vout of the photo diode P is set to the ground potential. At this time, the circuit configuration signal CONFIG that is output from the logic output circuit DIG becomes 1. Even after the input of the optical signal is completed, the circuit configuration signal CONFIG is kept at 1.

In FIG. 6(b), even after the preset signal nPRESET is negated, no optical signal is not input to the configuration information input circuit 6. In this case, the input capacitor C keeps the state of being charged, and the circuit configuration signal CONFIG is maintained at 0. The input capacitor C gradually discharges while taking several tens milliseconds due to the leak current, and the cathode voltage Vout of the photo diode P gradually decreases from the power source voltage Vc. However, during a period in which the cathode voltage Vout of the photo diode P is higher than the logic threshold voltage of the logic output circuit DIG, the circuit configuration signal CONFIG is kept at 0.

In this way, the logic circuit configuration information input through the optical signal is kept at the input capacitor C of the photo diode P.

According to the configuration information input circuit 6 in FIG. 5(b), the preset switching element M and the photo diode P are switched in positions in the configuration information input circuit 6 in FIG. 5(a). With such a circuit, similarly to the case in FIG. 5(a), the logic circuit configuration information that is input with use of the optical signal is held at the input capacitor C of the photo diode P and can be output as the circuit configuration signal CONFIG.

It should be noted that with the circuit in FIG. 5(b), in the case where the optical signal is input to the configuration information input circuit 6, the circuit configuration signal CONFIG is set to 0, and in the case where no optical signal is input, the circuit configuration signal CONFIG is set to 1.

Figure 7:
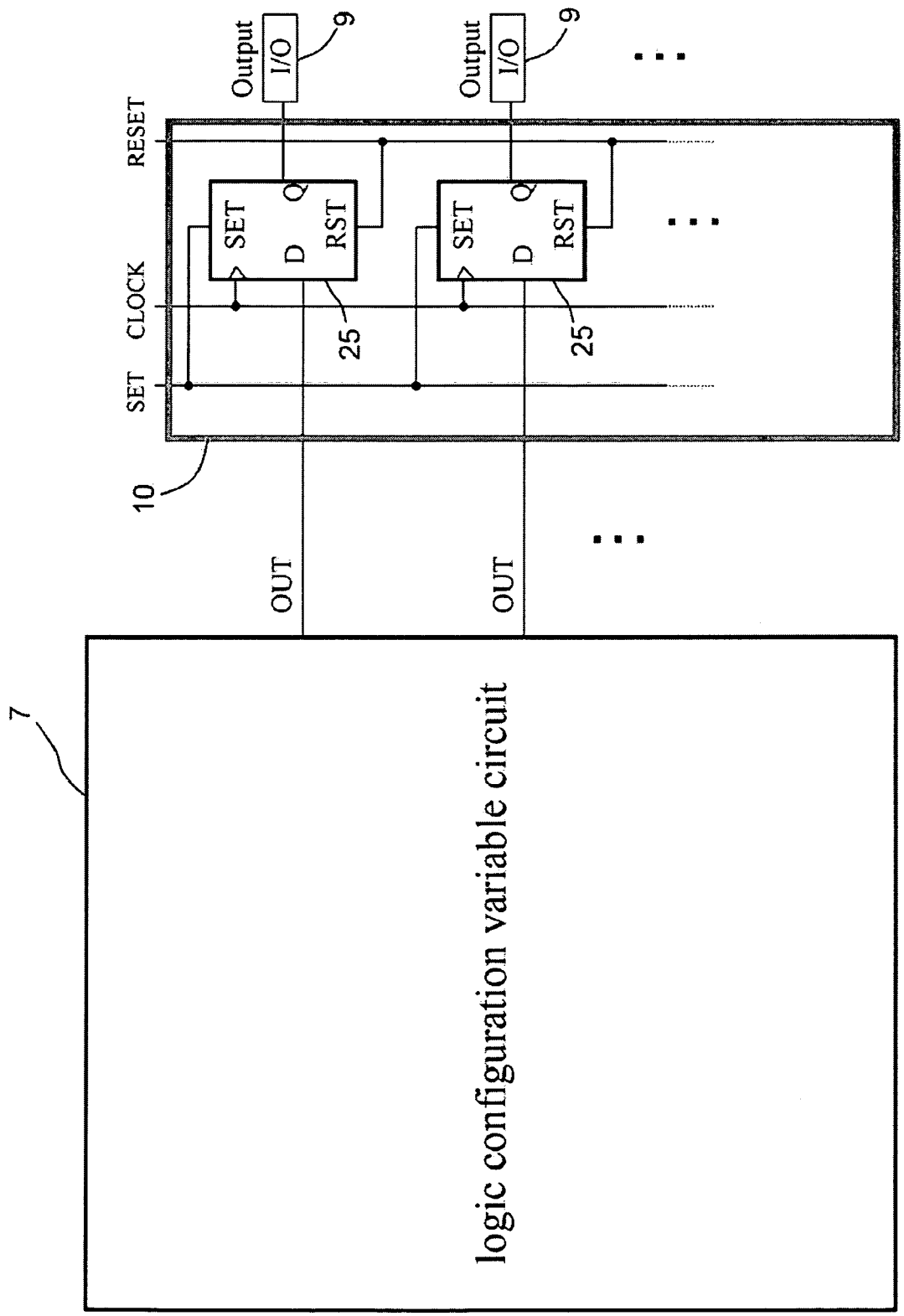
[FIG. 7] A diagram of a configuration of an output holding circuit.

FIG. 7 is a diagram of a configuration example of the output holding circuit 10. The output holding circuit 10 is provided with one DFF 25 with respect to each of output lines OUT of the logic configuration variable circuit 7. At the initial rise of the clock CLOCK, the DFF 25 takes in and holds the output value OUT of the logic configuration variable circuit 7. The DFF 25 outputs the held output value to the input/output circuit 9. The output holding circuit 10 is provided for preventing such a situation that the output of the logic configuration variable circuit 7 becomes undetermined while the reconfiguration is conducted on, the logic structure of the internal circuit.

Operations of the optically reconfigurable logic circuit configured as described above will be described below.

First of all, the logic structure of the internal circuit of the logic configuration variable circuit 7 is configured. Firstly, the preset control section 11 asserts the preset signal nPRESET for a predetermined period, the input capacitor C of the photo diode P of the respective configuration information input circuits 6 is charged. When the charging is completed, the irradiation light control section 12 controls the light irradiation section 5 so that the light irradiation section 5 irradiates the optical memory 4 with the reference light at a desired angle. As a result, the logic circuit configuration information recorded in the optical memory 4 is taken out as the optical signal. This optical signal is input to the photo diode P of the respective configuration information input circuits 6. The photo diode P irradiated with the light discharges the electric charge which has been charged at the input capacitor C of the photo diode P as described above. The photo diode P irradiated with no light holds the electric charge which has been charged at the input capacitor C of the photo diode P. The operation of the reconfiguration on such a logic structure of the internal circuit of the logic configuration variable circuit 7 is referred to as "refresh operation". The refresh operation is immediately completed within one clock period.

Then, when the logic configuration variable circuit 7 completes the above-mentioned refresh operation, the logic circuit executes the logic arithmetic processing.

On the other hand, at the photo diode P irradiated with no light, the electric charge that has been charged at the input capacitor C of the photo diode P is gradually discharged due to the leak current. Then, a predetermined period of time elapses, the voltage between the terminals of the photo diode P becomes equal to or lower than the logic threshold of the logic output circuit DIG, and the logic circuit configuration information is lost. However, during a period in which the logic circuit configuration information is lost due to the leak current, the state of the logic configuration variable circuit 7 is maintained.

Before the logic circuit configuration information is lost due to the leak current, the above-mentioned refresh operation is executed again, thereby performing the reconfiguration on the logic structure of the internal circuit of the logic configuration variable circuit 7. In this way, the logic structure of the internal circuit of the logic configuration variable circuit 7 is dynamically reconfigured, whereby the logic configuration variable circuit 7 is maintained at a desired logic structure all the time.

It should be noted that when no logic circuit shuffle occurs while the electric charge is kept at the input capacitor C of the photo diode P, before the electric charge at the input capacitor C is completely discharged, the refresh operation needs to be performed with use of the identical logic circuit configuration information. However, the interval between the refresh operations is a relatively long time of several tens of milliseconds in general. For that reason, the case of performing the refresh operation with used of the identical logic circuit configuration information is rare, and it is needless to mention that such a refresh operation does not disturb the use of the optically reconfigurable logic circuit 1.

In this way, for holding the logic circuit configuration information at the configuration information input circuits 6, while the input capacitor C of the photo diode P is use and the refresh operation is dynamically and repeatedly used without using any specifically designed memory element, the mount area of the configuration information input circuits 6 can be significantly reduced as compared with the prior art without disturbing the operations of the optically reconfigurable logic circuit 1.

EXAMPLE 1

As an example, a VLSI chip of the optically reconfigurable logic circuit 1 is designed with use of a CMOS standard process of 0.35 μm as shown in (Table 1). A core voltage and an I/O cell voltage are unified to 3.3 V. A cell size of the photo diode P is set to 25.5 μm×25.5 μm, and a cell size including the preset switching element M and the logic output circuit DIG is set to 40.5×33.0 μm. A pn photo diode is used for the photo diode P and composed between an N well and a P substrate. Photo diode cells are located every 99 μm on two-dimension. The total number of the photo diodes P is set to 605. Under such conditions, the optically reconfigurable logic circuit 1 is designed. While the mount area of the conventional ODRGA reconfiguration circuit is 618.75 μm², the mount area of the reconfiguration circuit according to this embodiment can be reduced to 74.25 μm².

(End of the Example)

TABLE 1

| Technology | 0.35 μm double-poly triple-metal CMOS process |
|---|---|
| Chip size | 4.9 × 4.9 [mm] |
| Supply Voltage | Core 3.3 V, I/O 3.3 V |
| Photodiode size | 25.5 × 25.5 [μm] |
| Interval between Photodiodes | h = 99 v = 99 [μm] |
| Number of Photodiodes | 605 |
| Number of Logic Blocks | 4 |
| Number of Switching Matrices | 5 |
| Number of I/O bits | 16 |

The mount area I of the reconfiguration circuit is defined by (Expression 1).

$$I=(P+R)\times N \quad \text{[Expression 1]}$$

Herein, reference symbol P denotes the mount area of the photo diodes and reference symbol R denotes a mount area of other circuit parts including a flip-flop, a latch, an inverter, and other transistors. Reference symbol N denotes the number of programming elements. In the above-mentioned design of (Example 1), the photo diode P is designed to have a large size for facilitating the aligning between the VLSI section 3 and the optical section 2. However, if the aligning accuracy is increased, it is considerable that this size may be smaller than 25 μm². At that time, as a relation P<<R is established, it is extremely important to decrease R for reducing the mount area I.

The optically reconfigurable logic circuit 1 according to this embodiment reduces the mount area to ⅛ or smaller as compared with the conventional circuit. This size is significantly effective for increasing the gate density.

Figure 8:
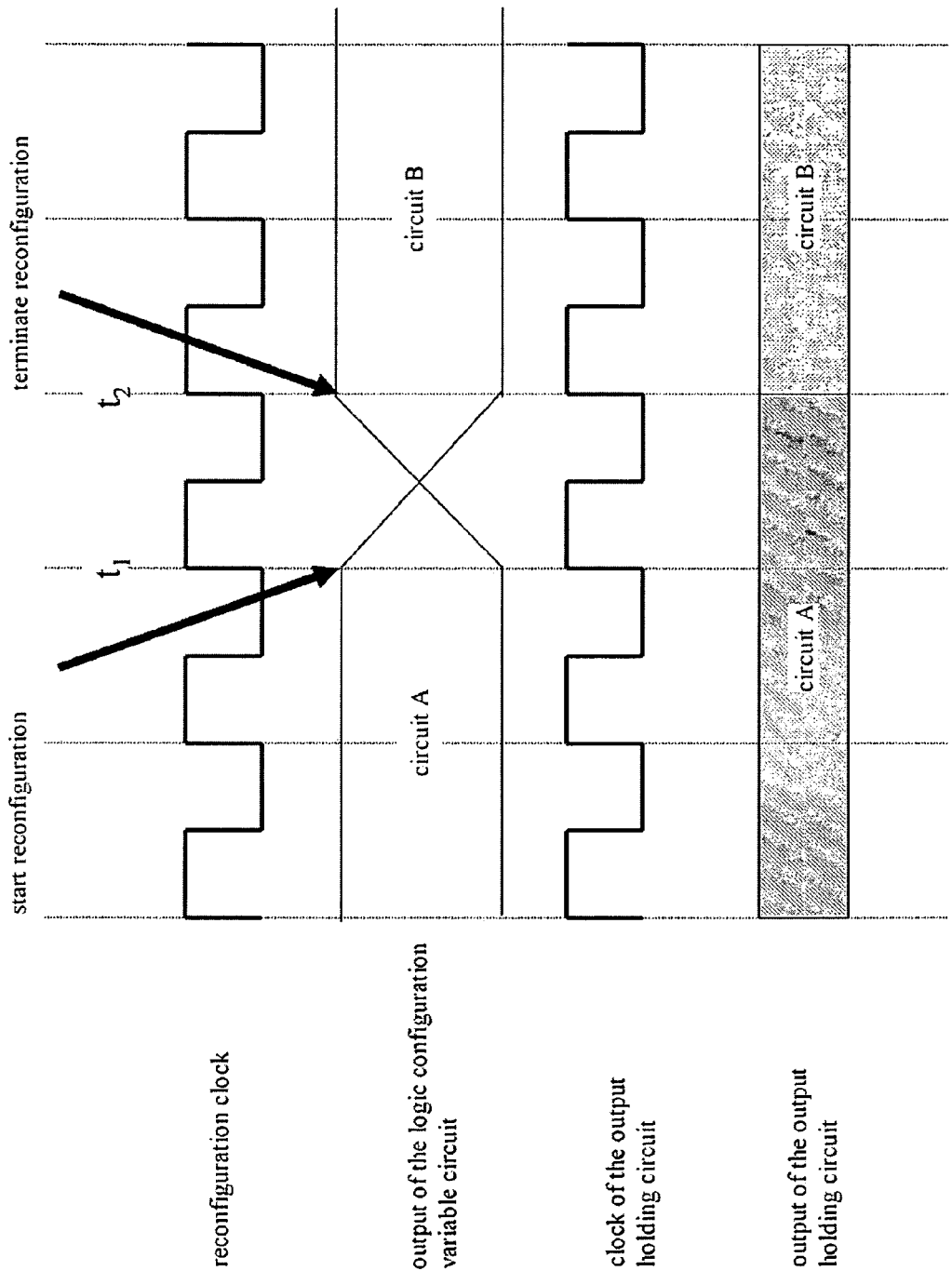
[FIG. 8] A timing drawing for describing operations of the output holding circuit.

Finally, the operations of the output holding circuit 10 will be described collaterally. FIG. 8 is a timing chart for a relation between the respective blocks and the output value of the output holding circuit 10 before and after the refresh operation of the logic configuration variable circuit 7. In FIG. 8, a reconfiguration clock represents a clock to be input to the preset control section 11, the irradiation light control section 12, and the timer 13. Herein, the identical clock CLOCK is used for the clock input to the output holding circuit 10 and the reconfiguration clock.

During one clock period from the time $t_1$ to the time $t_2$, the above-mentioned refresh operation is conducted, whereby the logic configuration variable circuit 7 is reconfigured from a circuit A to a circuit B. As a result, during the period from the time $t_1$ to the time $t_2$, the output value OUT of the logic configuration variable circuit 7 temporarily becomes undetermined. On the other hand, the output holding circuit 10 takes in and holds the output value OUT of the logic configuration variable circuit 7 at the initial rise of the clock CLOCK and outputs it to the input/output circuit 9. Therefore, at the initial rise of the clock CLOCK at the time $t_1$, the output holding circuit 10 keeps outputting the value while the output value of the circuit A is kept by the time $t_2$. Then, at the initial rise of the clock CLOCK at the time $t_2$, the output holding circuit 10 holds the output value of the circuit B and outputs it. As a result, during the period from the time $t_1$ to the time $t_2$, such a situation is prevented that the output value of the optically reconfigurable logic circuit 1 becomes undetermined.

Figure 9:
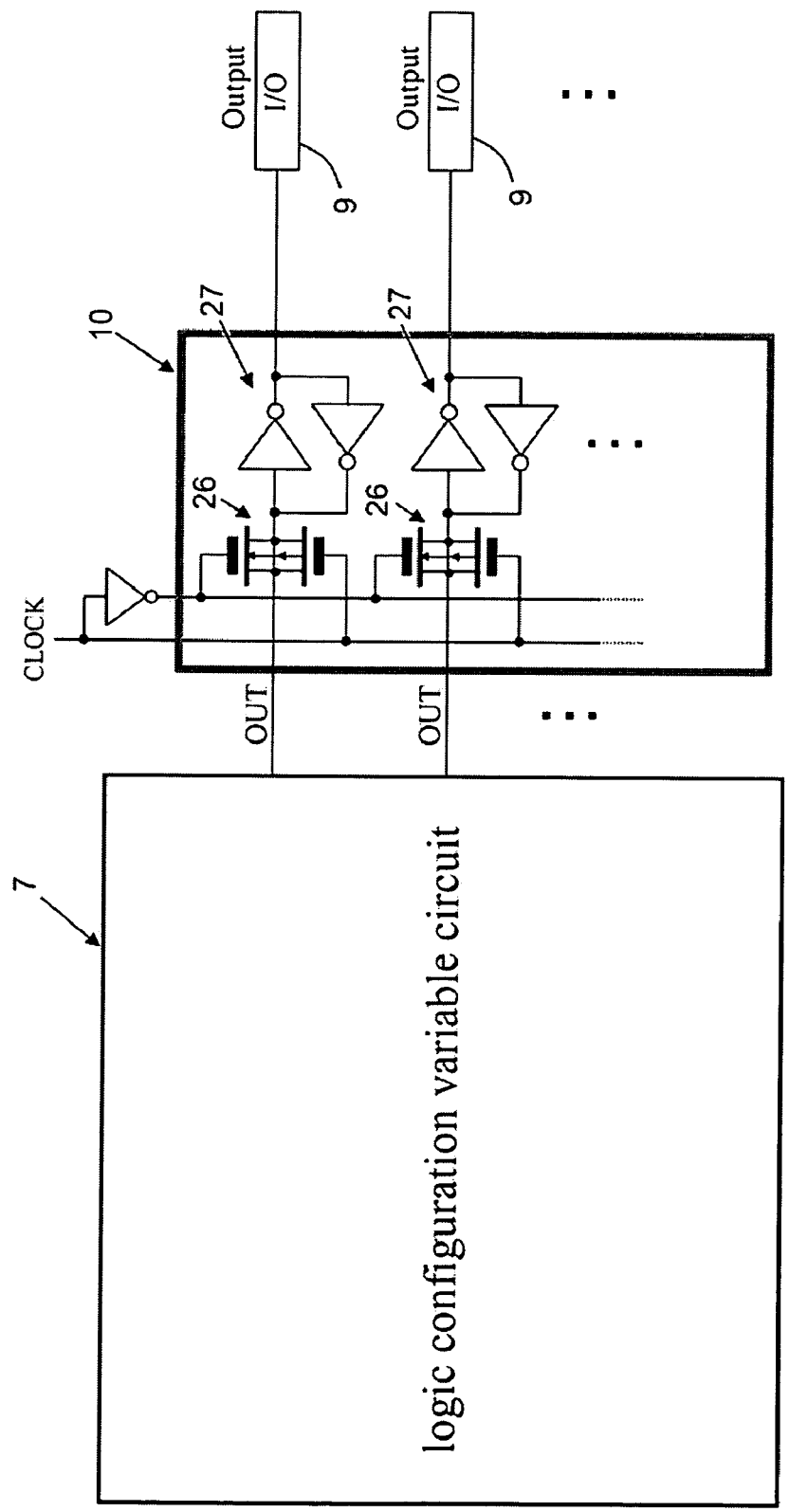
[FIG. 9] A diagram of another configuration of the output holding circuit.

It should be noted that FIG. 7 shows the example in which the DFF 25 is used for the output holding circuit 10, but a configuration including a transmission gate 26 and a latch 27 shown in FIG. 9 may be used for the configuration of the output holding circuit 10.

As described above, in the optically reconfigurable logic circuit 1 according to this embodiment, an unnecessary memory function of the VLSI section having the conventional ORGA or ODRGA is eliminated. In other words, in the conventional ORGA or ODRGA, the memory function (the "memory function" herein is a function for constantly holding information and is not a function for temporarily holding information) is present in both the optical section and the VLSI section. In the optically reconfigurable logic circuit 1 according to this embodiment, the redundant memory function of the VLSI section is eliminated. Then, such a method is adopted for temporarily holding the logic circuit configuration information that is input from the optical section with use of the junction capacitance and the floating capacitance of the photo diode. In a shorter interval than a time period in which the held logic circuit configuration information disappears due to the leak current, the refresh operation is repeatedly performed on the junction capacitance and the floating capacitance of the photo diode, whereby the optical section is caused to maintain the logic circuit configuration of the VLSI section by sequentially transferring the held logic circuit configuration information to the VLSI section. With the adoption of such a dynamic method, the redundant memory function is removed and it is possible to significantly decrease the mount area of the VLSI section.

Second Embodiment

Figure 10:
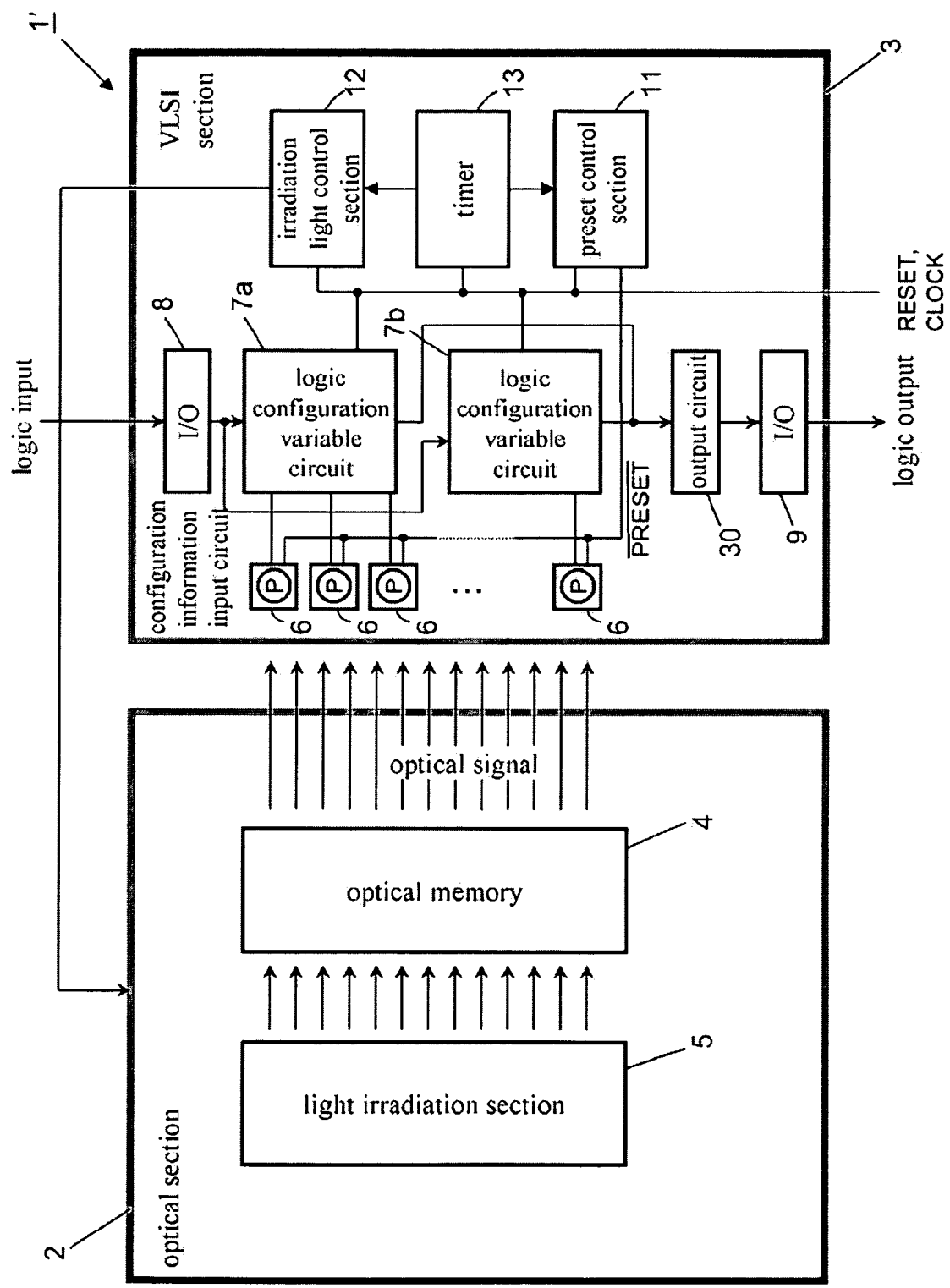
[FIG. 10] A block diagram of an entire function configuration of an optically reconfigurable logic circuit according to a second embodiment of the present invention.

FIG. 10 is a block diagram of an entire function configuration of an optically reconfigurable logic circuit according to a second embodiment of the present invention. the optically reconfigurable logic circuit 1' according to this embodiment is basically the same as the optically reconfigurable logic circuit 1 shown in FIG. 1, but in the VLSI section 3, but is provided with two of the logic configuration variable circuits 7a and 7b having the same configuration and includes an output circuit 30 composed of an open collector circuit instead of the output holding circuit 10. In addition, the light irradiation section 5 can independently input optical signals to the respective logic configuration variable circuits 7a and 7b. Furthermore, the irradiation light control section 12 also functions as reconfiguration control means for controlling the logic reconfiguration while performing a switch so that at the same point in time, one of the logic configuration variable circuits 7a and 7b is only irradiated with the optical signal.

Figure 11:
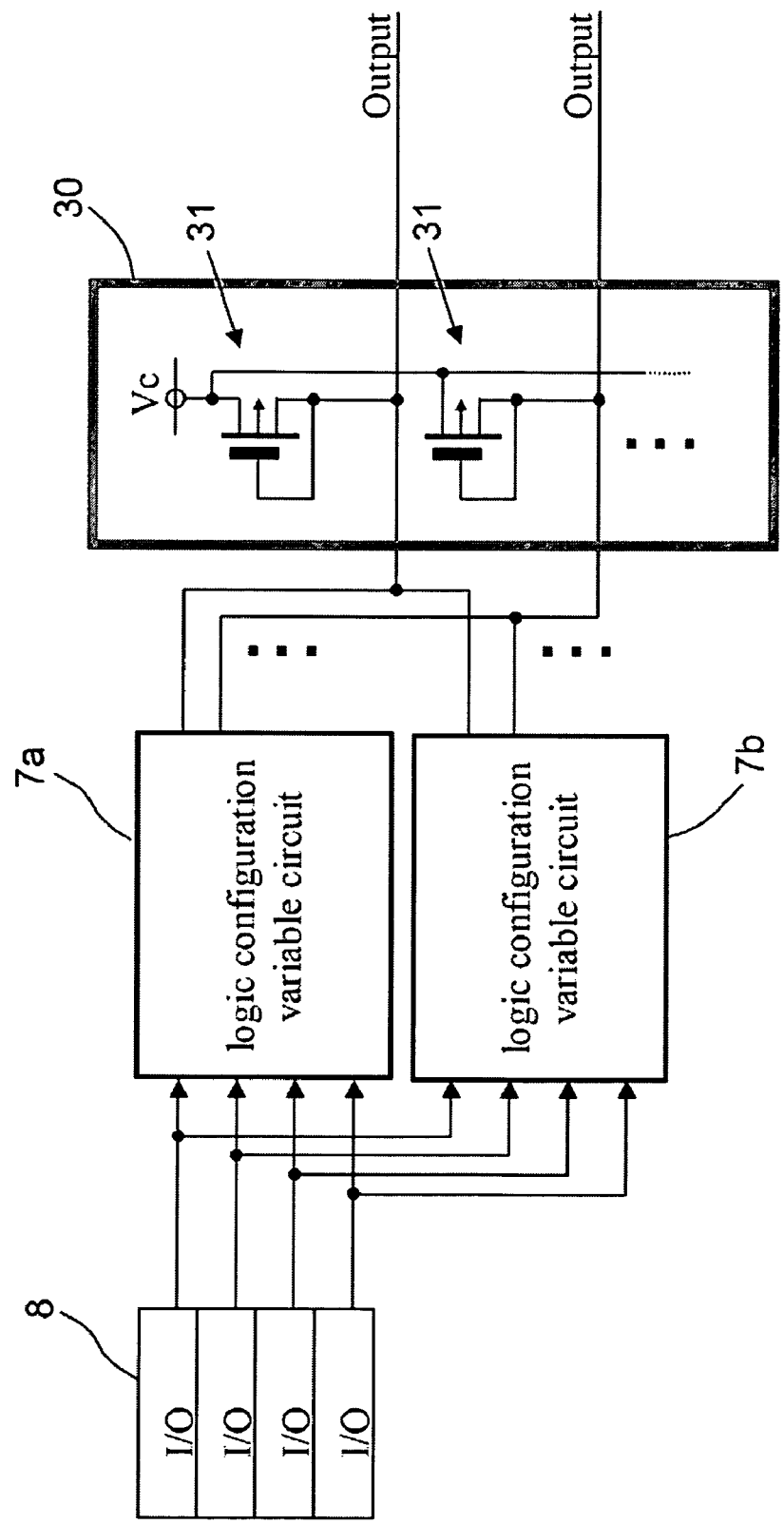
[FIG. 11] A diagram of a configuration of an output circuit.

FIG. 11 is a diagram of a configuration of the output circuit 30. The logic configuration variable circuits 7a and 7b are connected in parallel so as to have a common input/output line for the logic variant. The output circuit 30 is provided with an open collector circuit 31 with respect to respective output lines of the logic circuits 7a and 7b.

The identical logic circuit configuration information is input to the logic configuration variable circuits 7a and 7b, thereby structuring the identical logic configuration.

In such a configuration, when the refresh operation is performed, first of all, the irradiation light control section 12 performs such a control that the optical signal is input to the logic configuration variable circuit 7a with use of the optical section 2. At this time, no optical signal is input to the logic configuration variable circuit 7b, and thus the original logic configuration is kept. Therefore, while the logic circuit of the logic configuration variable circuit 7a is configured, the output value of the optically reconfigurable logic circuit 1' is guaranteed by the logic configuration variable circuit 7b.

When the reconfiguration on the logic configuration variable circuit 7a is completed, subsequently, the irradiation light control section 12 inputs the optical signal of the identical logic circuit configuration information to the logic configuration variable circuit 7b with use of the optical section 2 and performs such a control that the reconfiguration on the logic circuit of the logic configuration variable circuit 7b is conducted. At this time, no optical signal is input to the logic configuration variable circuit 7a, and accordingly the newly structured logic configuration is kept. Therefore, while the logic circuit of the logic configuration variable circuit 7b is structured, the output value of the optically reconfigurable logic circuit 1' is guaranteed by the logic configuration variable circuit 7a.

In this way, according to this embodiment, the open collector circuits 31 are provided at the output stages of the logic configuration variable circuits 7a and 7b, and when the refresh operation is performed, while one of the configurations of the logic configuration variable circuits is kept, the other logic circuit reconfiguration is performed, whereby it is possible to prevent such a situation that during the refresh operation of the logic circuit, the output value of the optically reconfigurable logic circuit 1' becomes undetermined.

It should be noted that in this embodiment, the two logic configuration variable circuits 7a and 7b are used to perform the switching on the refresh operation, but three or more logic configuration variable circuits may be used to perform the switching on the refresh operation.

Third Embodiment

Figure 12:
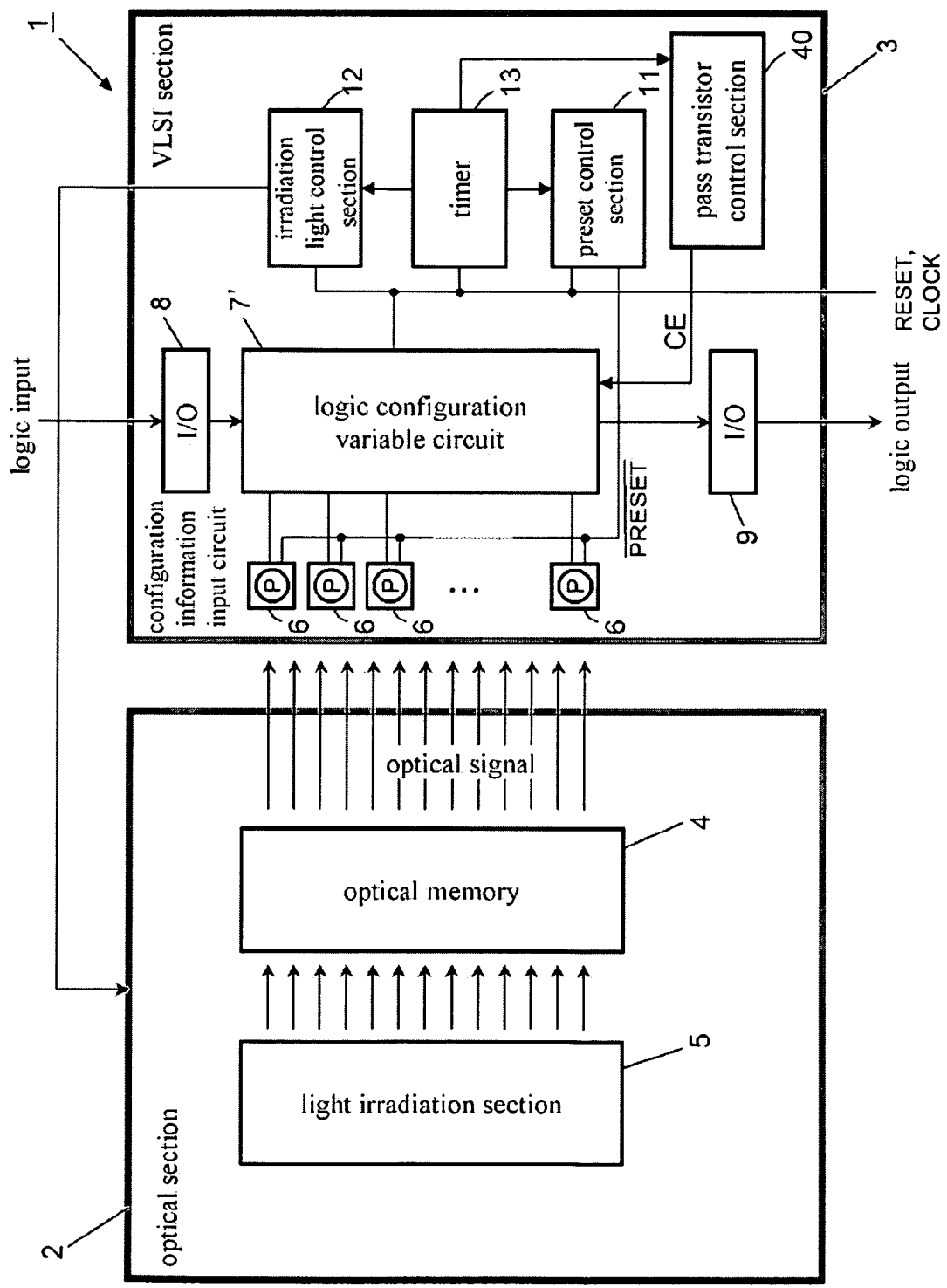
[FIG. 12] A block diagram of an entire function configuration of an optically reconfigurable logic circuit according to a third embodiment.

FIG. 12 is a block diagram of an entire function configuration of an optically reconfigurable logic circuit 1 according to a third embodiment. The optically reconfigurable logic circuit 1 according to this embodiment has different points from the optically reconfigurable logic circuit 1 according to the first embodiment (refer to FIG. 1) in that the output holding circuit 10 is omitted, the logic configuration variable circuit 7 is replaced by the logic configuration variable circuit 7', and a pass transistor control section 40 is newly added, and other configurations are identical. The logic configuration variable circuit 7' has the same configurations described in FIGS. 2 to 4 but is different from the first embodiment in terms of the structure of the configuration information input circuit 6 (FIG. 5).

Figure 13:
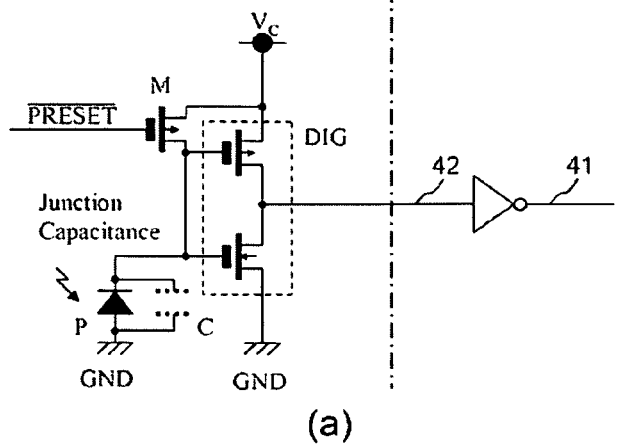
[FIG. 13] A diagram for displaying the configuration information input circuit at transistor level.
Figure 13:
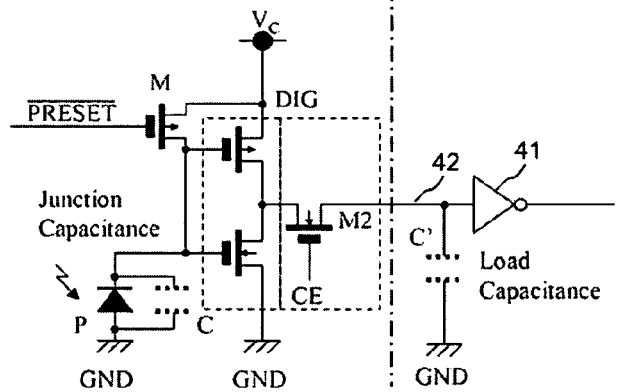

The difference between the structure of the configuration information input circuit 6 according to the first embodiment and that of the configuration information input circuit 6 according to the third embodiment is shown in FIG. 13.

FIG. 13(a) shows the configuration information input circuit 6 in FIG. 5(a) at a transistor level. Reference numerals in the respective circuit elements correspond to FIG. 5(a). In FIG. 13(a), the left-hand side of a dashed-dotted line in the center represents the configuration information input circuit 6 and the right-hand side of the dashed-dotted line represents the logic configuration variable circuit 7 (gate array circuit). In FIG. 13(a), only an input buffer 41 is shown and other parts are omitted with regard to the logic configuration variable circuit 7. In this way, the logic output circuit DIG is structured by a normal inverter circuit composed of two PMOSs.

As described above, in this circuit, the configuration information of the logic configuration variable circuit 7 is stored in the input capacitor C that is the junction capacitance of the photo diode P. The minimum configuration elements of the configuration information input circuit 6 in FIG. 13(a) are only the photo diode P and the preset switching element M (the logic output circuit DIG may be added as necessary), and therefore there is a merit of easily fabricating the optically reconfigurable logic circuit of the high gate number.

The reconfiguration procedure for the optically reconfigurable logic circuit 1 according to the first embodiment using the configuration information input circuit in FIG. 13(a) is as follows. First of all, the preset signal nPRESET is asserted for a given time by the preset control section 11, thereby achieving continuity of the preset switching element M. As a result, the programming state of the logic configuration variable circuit 7 is cleared once. After the junction capacitance of the photo diode P (that is, the input capacitor C) is fully charged, the optical signal is irradiated and input from the optical section 2. As a result, the circuit configuration information is written to the respective photo diodes P, and the information is held at the input capacitor C.

Figure 14:
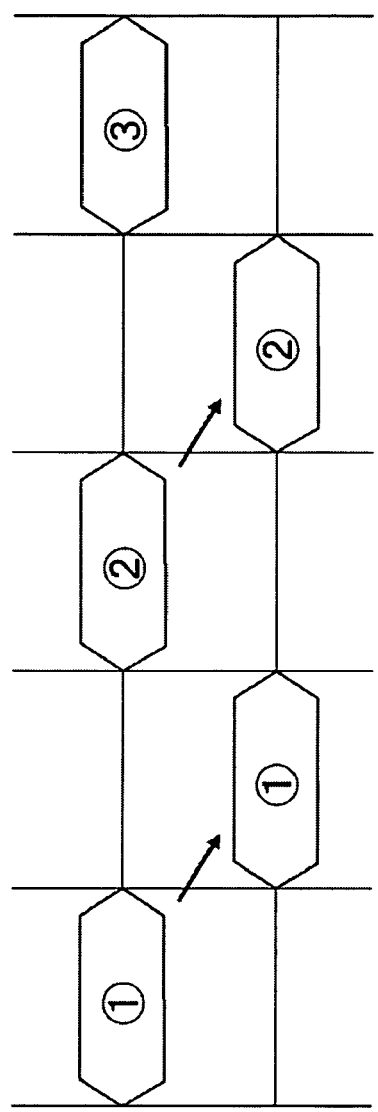
[FIG. 14] A timing chart for the reconfiguration operations on the optically reconfigurable logic circuit according to the first embodiment and the execution of the logic configuration variable circuit.

While this reconfiguration procedure is executed, the logic configuration variable circuit 7 cannot operate as the logic circuit is in the undetermined state, and the execution of the logic configuration variable circuit 7 is not performed until the reconfiguration procedure is completed. FIG. 14 is a timing chart for a timing of the reconfiguration operation of the optically reconfigurable logic circuit 1 according to the first embodiment and the execution of the logic configuration variable circuit 1. As shown in FIG. 14, the logic circuit reconfiguration operation and the execution of the logic configuration variable circuit 7 are not performed in parallel. In the case of an application in which the optically reconfigurable logic circuit 1 is dynamically reconfigured, this overhead is too long to ignore.

Whereas FIG. 13(b) shows the configuration information input circuit 6 according to the third embodiment at a transistor level. In FIG. 13(b) as well, the left-hand side of a dashed-dotted line in the center represents the configuration information input circuit 6 and the right-hand side of the dashed-dotted line in the center represents the logic configuration variable circuit 7 (gate array circuit). Also, with regard to the logic configuration variable circuit 7, only the input buffer 41 is shown and other parts are omitted. When FIG. 13(*b*) is compared with FIG. 13(*a*), the configuration information input circuit 6 according to this embodiment is characterized in that a pass transistor M2 is newly provided at the output stage of the logic output circuit DIG. The pass transistor M2 performs continuity/interruption of a circuit configuration signal transmission line 42 for outputting the circuit configuration signal from the configuration information input circuit 6 to the logic configuration variable circuit 7. A configuration enable signal (Configuration Enable signal) CE that is output from the pass transistor control section 40 is input to a gate terminal of the pass transistor M2. As a result, the interruption/continuity of the pass transistor control section 40 is controlled by the pass transistor control section 40.

The configuration information input circuit 6 according to the third embodiment shown in FIG. 13(*b*) while the circuit configuration signal of the input capacitor C is updated, the previous circuit configuration signal is held at a parasitic capacitance (hereinafter referred to as "output capacitor C'") of the circuit configuration signal transmission line 42 or an input state of the logic configuration variable circuit 7 to which the circuit configuration signal transmission line 42 is connected. The input stage of the logic configuration variable circuit 7 is usually structured by an inverter gate, a NAND gate, a transmission gate, and the like, and the output capacitor C' of the input stage has sufficient capacitance with which the previous circuit configuration signal is held while the circuit configuration signal of the input capacitor C is updated. Therefore, after the pass transistor M2 is interrupted, the circuit configuration signal is held at the output capacitor C', and even while the circuit configuration signal of the input capacitor C is updated, the logic configuration of the logic configuration variable circuit 7 can be maintained.

Figure 15:
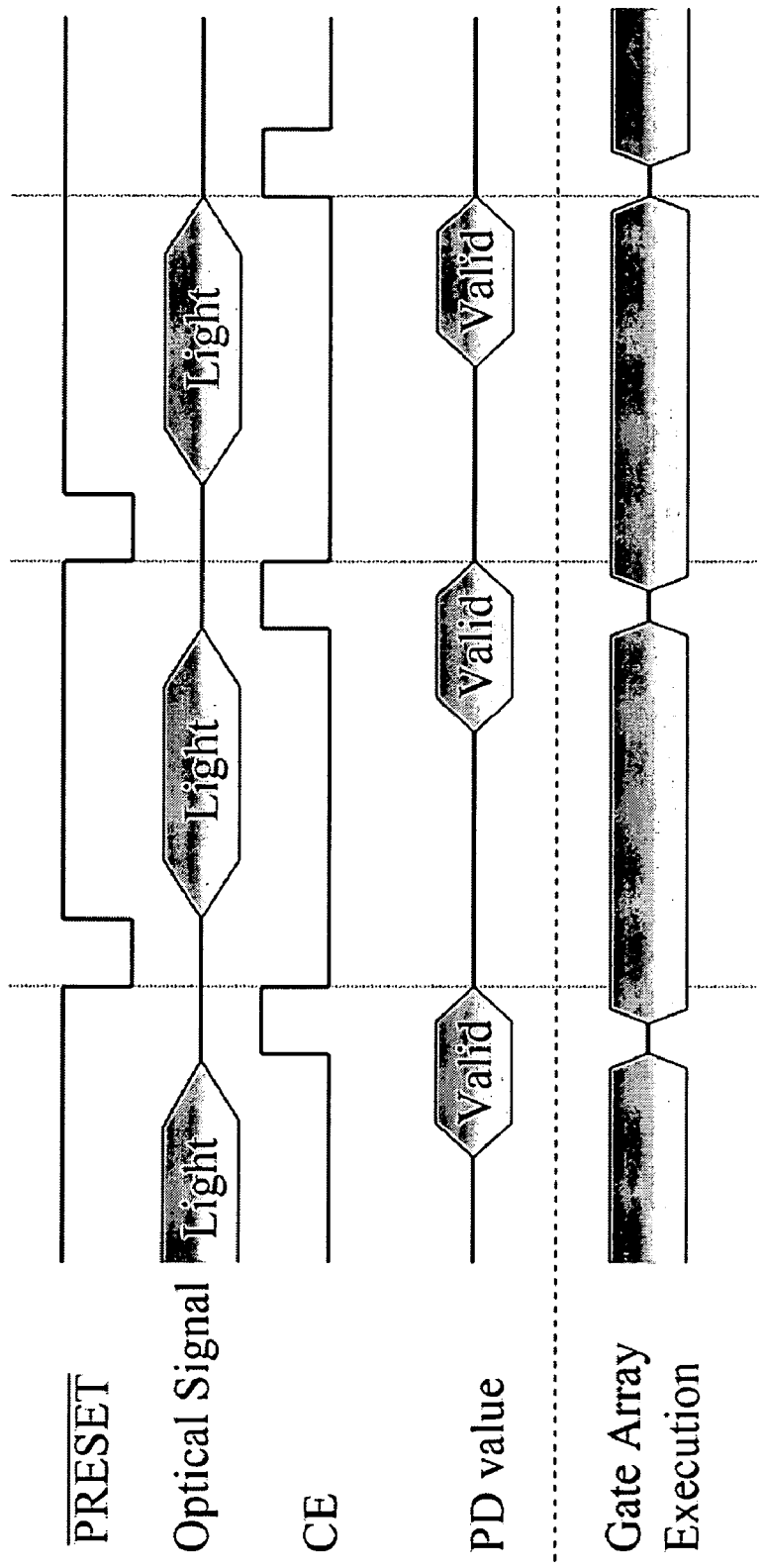
[FIG. 15] A timing chart for the reconfiguration operations on the optically reconfigurable logic circuit according to the third embodiment and the execution of the logic configuration variable circuit.

FIG. 15 is a timing chart for a timing in which the reconfiguration operation on the optically reconfigurable logic circuit 1 according to the third embodiment and the execution of the logic configuration variable circuit 7. After the optical signal for the programming of the logic configuration variable circuit 7 is input, the configuration enable signal CE is asserted for a given time, and thus the circuit configuration signal is input to the logic configuration variable circuit 7 and the output capacitor C'. The pulse width in which the configuration enable signal CE is asserted is set longer at least than a period of the logic reconfiguration on the logic configuration variable circuit 7. As a result, the reconfiguration interval is a sum of the pulse width of the preset nPRESET, the irradiation period of the optical signal, and the pulse width of the configuration enable signal CE. While the enable signal CE is negated, even in the irradiation period of the optical signal, the circuit configuration information is held at the output capacitor C'. The execution of the logic configuration variable circuit 7 and the reconfiguration operation of the optically reconfigurable logic circuit 1 can be performed in parallel, whereby it is possible to accelerate the dynamic reconfiguration and the execution of the gate array.

Figure 16:
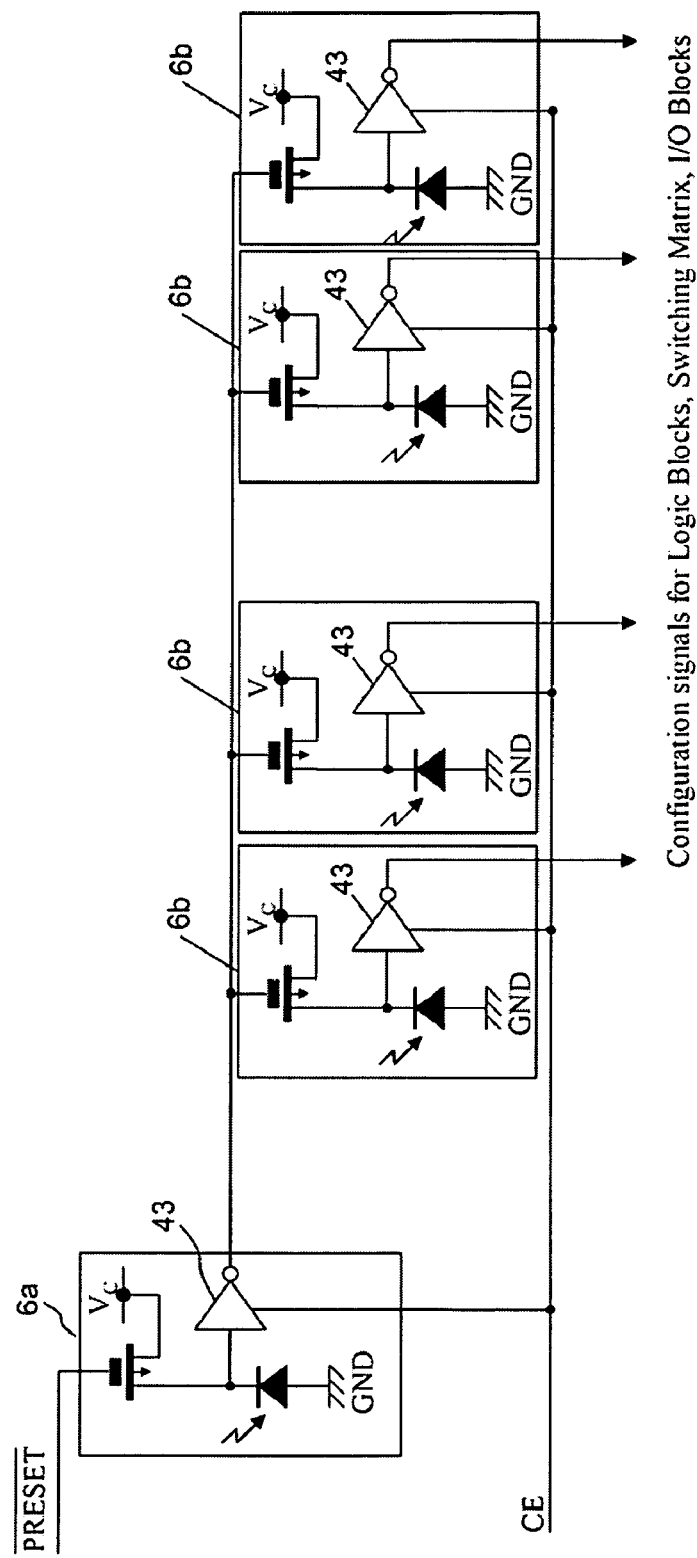
[FIG. 16] A circuit diagram of a dynamic optically reconfiguration array for performing partial reconfiguration according to the third embodiment.

Furthermore, as shown in FIG. 16, a circuit for performing partial reconfiguration can be easily structured. In FIG. 16, the logic output circuit with the pass transistor 43 is shown by integrating the logic output circuit DIG and the pass transistor M2 in FIG. 13(*b*). The dynamic optical reconfiguration array has a plurality of configuration information input circuits 6*b* connected in parallel with respect to one optical reconfiguration instruction circuit 6*a*. The optical reconfiguration instruction circuits 6*a* and 6*b* have the same configuration as that shown in FIG. 13(*b*). To the preset switching elements M of the respective optical reconfiguration instruction circuits 6*a*, the preset signal nPRESET from the preset control section 11 is input. Then, an output of a logic output circuit with pass transistor 43 of the optical reconfiguration instruction circuit 6*a* is input to the preset switching element M of the respective configuration information input circuits 6*b*. Furthermore, the output of the logic output circuit with the pass transistor 43 of the respective configuration information input circuits 6*b* is input to the logic configuration variable circuit 7 as the circuit configuration signal.

Figure 17:
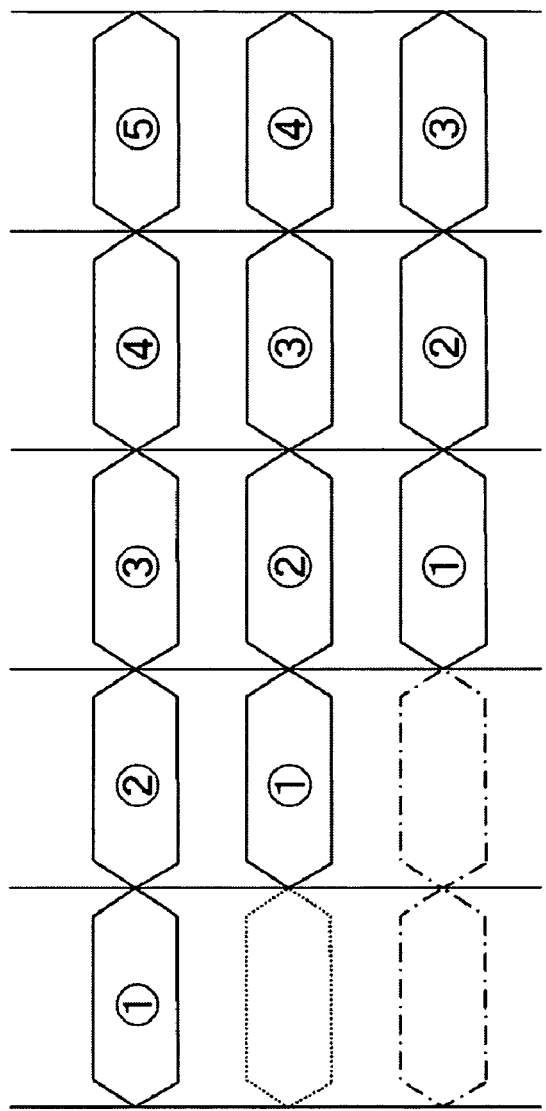
[FIG. 17] A timing chart of an operation schedule for dynamic reconfiguration operations of the dynamic optically reconfiguration array in FIG. 16 and the execution of the logic configuration variable circuit.
Figure 18:
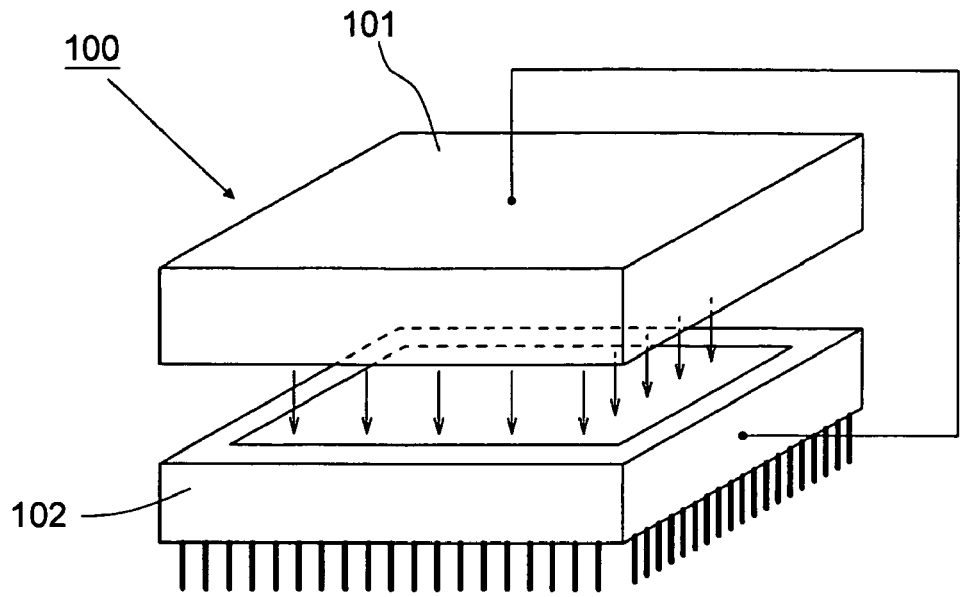
[FIG. 18] A diagram of a configuration of the optically reconfigurable logic circuit.
Figure 19:
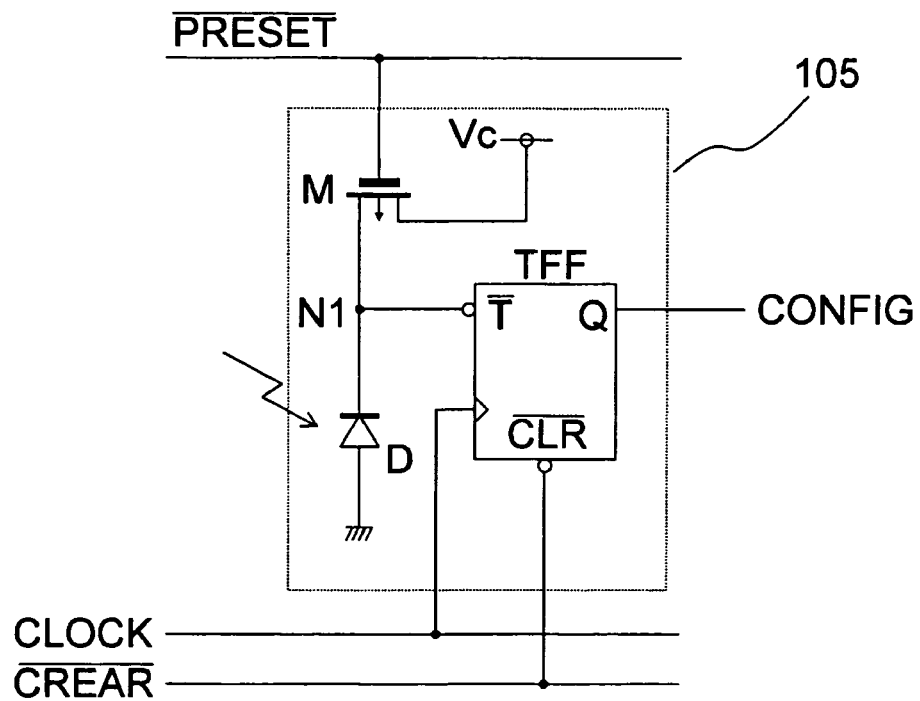
[FIG. 19] A diagram of an example of the configuration information input circuit in a conventional optically reconfigurable logic circuit.

FIG. 17 shows a schedule for the dynamic reconfiguration on the dynamic optical reconfiguration array for performing the partial reconfiguration and the execution of the logic configuration variable circuit 7. The respective logic blocks 15, the respective switching matrices 16, and the I/O blocks 14 in FIG. 2 are provided with the optical reconfiguration instruction circuits 6*a*. The preset signal nPRESET of the respective configuration information input circuits 6*b* in each of the blocks is driven by the optical reconfiguration instruction circuit 6*a* of the corresponding block. First of all, an optical signal is input to the optical reconfiguration instruction circuit 6*a* of the block that should be reconfigured first. Next, the circuit of the block that includes the optical reconfiguration instruction circuit 6*a* irradiated with the optical signal is reconfigured. Finally, execution of the reconfigured gate array circuit is performed. In this way, the operation for each block can be performed in a pipe line manner as shown in FIG. 17.

INDUSTRIAL APPLICABILITY

The present invention is useful as the programmable logic circuit that can optically rewrite the logic configuration in various electric appliance industries.

The invention claimed is:

1. An optically reconfigurable logic circuit, comprising:
    a configuration information input circuit that includes a photoconductive device for causing continuity/interruption in response to light irradiation input, and converts and outputs an optical signal that contains logic circuit configuration information with use of the photoconductive device into an electric circuit configuration signal; and
    a logic configuration variable circuit for performing logic configuration of an internal circuit on the basis of the circuit configuration signal,
    the optically reconfigurable logic circuit being characterized in that a control is performed in such a manner that the logic circuit configuration information input from the optical signal is held at a parasitic capacitance (hereinafter referred to as "input capacitor") between the terminals of the photoconductive device in a non-continuity state as the circuit configuration signal, and as the input capacitor is preset and a next optical signal is input before the held circuit configuration signal disappears due to leak discharge, the logic circuit configuration information is dynamically held at the input capacitor.

2. The optically reconfigurable logic circuit according to claim 1, characterized in that the photoconductive device is a photo diode subjected to reverse bias connection.

3. The optically reconfigurable logic circuit according to claim 1, characterized in that the configuration information input circuit comprises a logic output circuit for quantizing an inter-terminal voltage of the photoconductive device and outputting the resultant as a logic output value, and the logic output circuit quantizes an electric signal which is output when the photoconductive device converts the optical signal, and outputs the resultant as the circuit configuration signal.

4. The optically reconfigurable logic circuit according to claim 1, further comprising:
preset control means for performing a preset control for charging the input capacitor by applying the photoconductive device with a preset voltage in a reverse bias direction;
irradiation light control means for performing irradiation control for writing logic circuit configuration information to the configuration information input circuit by setting the optical signal in an on state in a predetermined period of time and causing continuity of the irradiated photoconductive device on the basis of the optical signal after the input capacitor is charged through the preset control; and
timing generation means for outputting a preset timing signal to the preset control means with a predetermined delay time after the logic circuit configuration information is written to the configuration information input circuit through the irradiation light control, the optically reconfigurable logic circuit characterized in that the preset control means executes the preset control when the preset timing signal is input.

5. The optically reconfigurable logic circuit according to claim 4, characterized in that the timing generation means outputs a preset timing signal to the preset control means with a delay time shorter than a period in which the inter-terminal voltage of the photoconductive device that is previously set to the preset voltage through the preset control falls to be equal or lower than a predetermined logic threshold due to the leak discharge.

6. The optically reconfigurable logic circuit according to claim 4, characterized in that the configuration information input circuit includes a preset switching element for performing turning on/off of the preset voltage applied between electrodes of the photoconductive device, and the preset control means asserts in a predetermined period the preset signal for turning on the preset switching element.

7. The optically reconfigurable logic circuit according to claim 4, further comprising logic output holding means for holding a logic output value of the logic configuration variable circuit at a timing before a time point when the inter-terminal voltage of the photoconductive device falls to be equal to or lower than the predetermined logic threshold as the input capacitor charged to the preset voltage through the preset control involves leak discharge.

8. The optically reconfigurable logic circuit according to claim 7, characterized in that the configuration information input circuit includes a preset switching element for performing turning on/off of a preset voltage that is applied between the electrodes of the photoconductive device, the preset control means asserts in a predetermined period the preset signal for turning on the preset switching element, and the logic output holding means holds the logic output value of the logic configuration variable circuit at a timing before the preset control means asserts the preset signal.

9. The optically reconfigurable logic circuit according to claim 4, characterized by further comprising:
a pass transistor for causing continuity/interruption of a circuit configuration signal transmission line for inputting the circuit configuration signal, which is output from the configuration information input circuit, to the logic configuration variable circuit; and
pass transistor control means for performing such a control that the circuit configuration signal is held at one of the circuit configuration signal transmission line and a parasitic capacitance (hereinafter referred to as "output capacitor") of an input circuit of the logic configuration variable circuit to which the circuit configuration signal transmission line is connected as the pass transistor is set in the interruption state during the irradiation of the optical signal.

10. The optically reconfigurable logic circuit according to claim 8, characterized in that the pass transistor control means performs such a control that, after irradiation of the optical signal, as the input capacitor charged to the preset voltage through the preset control involves leak discharge, before a time point when the inter-terminal voltage of the photoconductive device falls to be equal or lower than the predetermined logic threshold, at least during a period in which logic reconfiguration on the logic configuration variable circuit is completed, the pass transistor is set in the continuity state, and during the irradiation of the optical signal, the pass transistor is set in the interrupted state.

11. The optically reconfigurable logic circuit according to claim 4, further comprising optical signal input means for irradiating the configuration information input circuit that contains the logic circuit configuration information, the optically reconfigurable logic circuit being characterized in that the irradiation light control means controls turning on/off of selection and irradiation of the optical signal output from the optical signal input means.

12. The optically reconfigurable logic circuit according to claim 11, characterized in that at least two of the logic configuration variable circuits are connected in parallel to each other with a common input/output terminal for a logic variable, the optical signal input means can independently input an optical signal that contains the logic circuit configuration information to the configuration information input circuits corresponding to the respective logic configuration variable circuit, and the optical signal input means includes open collector circuits provided at output stages of the logic configuration variable circuits and reconfiguration control means for performing such a control on the optical signal input means that switching is performed among the logic configuration variable circuits connected in parallel to each other so that at the same time point, the configuration information input circuit corresponding to at least one of the logic configuration variable circuits is not irradiated with the optical signal and optical signals that contain the same logic circuit configuration information are input to the logic configuration variable circuits.

13. The optically reconfigurable logic circuit according to claim 2, characterized in that the configuration information input circuit comprises a logic output circuit for quantizing an inter-terminal voltage of the photoconductive device and outputting the resultant as a logic output value, and the logic output circuit quantizes an electric signal which is output when the photoconductive device converts the optical signal, and outputs the resultant as the circuit configuration signal.

14. The optically reconfigurable logic circuit according to claim 2, further comprising:
preset control means for performing a preset control for charging the input capacitor by applying the photoconductive device with a preset voltage in a reverse bias direction;
irradiation light control means for performing irradiation control for writing logic circuit configuration information to the configuration information input circuit by setting the optical signal in an on state in a predetermined period of time and causing continuity of the irradiated photoconductive device on the basis of the optical signal after the input capacitor is charged through the preset control; and timing generation means for outputting a preset timing signal to the preset control means with a predetermined delay time after the logic circuit configuration information is written to the configuration information input circuit through the irradiation light control, the optically reconfigurable logic circuit characterized in that the preset control means executes the preset control when the preset timing signal is input.

15. The optically reconfigurable logic circuit according to claim 3, further comprising:

preset control means for performing a preset control for charging the input capacitor by applying the photoconductive device with a preset voltage in a reverse bias direction;

irradiation light control means for performing irradiation control for writing logic circuit configuration information to the configuration information input circuit by setting the optical signal in an on state in a predetermined period of time and causing continuity of the irradiated photoconductive device on the basis of the optical signal after the input capacitor is charged through the preset control; and timing generation means for outputting a preset timing signal to the preset control means with a predetermined delay time after the logic circuit configuration information is written to the configuration information input circuit through the irradiation light control, the optically reconfigurable logic circuit characterized in that the preset control means executes the preset control when the preset timing signal is input.

16. The optically reconfigurable logic circuit according to claim 5, characterized in that the configuration information input circuit includes a preset switching element for performing turning on/off of the preset voltage applied between electrodes of the photoconductive device, and the preset control means asserts in a predetermined period the preset signal for turning on the preset switching element.

17. The optically reconfigurable logic circuit according to claim 5, further comprising logic output holding means for holding a logic output value of the logic configuration variable circuit at a timing before a time point when the inter-terminal voltage of the photoconductive device falls to be equal to or lower than the predetermined logic threshold as the input capacitor charged to the preset voltage through the preset control involves leak discharge.

18. The optically reconfigurable logic circuit according to claim 5, characterized by further comprising:

a pass transistor for causing continuity/interruption of a circuit configuration signal transmission line for inputting the circuit configuration signal, which is output from the configuration information input circuit, to the logic configuration variable circuit; and pass transistor control means for performing such a control that the circuit configuration signal is held at one of the circuit configuration signal transmission line and a parasitic capacitance (hereinafter referred to as "output capacitor") of an input circuit of the logic configuration variable circuit to which the circuit configuration signal transmission line is connected as the pass transistor is set in the interruption state during the irradiation of the optical signal.

19. The optically reconfigurable logic circuit according to claim 5, further comprising optical signal input means for irradiating the configuration information input circuit that contains the logic circuit configuration information, the optically reconfigurable logic circuit being characterized in that the irradiation light control means controls turning on/off of selection and irradiation of the optical signal output from the optical signal input means.

20. The optically reconfigurable logic circuit according to claim 6, further comprising optical signal input means for irradiating the configuration information input circuit that contains the logic circuit configuration information, the optically reconfigurable logic circuit being characterized in that the irradiation light control means controls turning on/off of selection and irradiation of the optical signal output from the optical signal input means.

* * * * *